(12) United States Patent
Morishita et al.

(10) Patent No.: US 9,376,616 B2
(45) Date of Patent: Jun. 28, 2016

(54) NANOPARTICLE PHOSPHOR AND METHOD FOR MANUFACTURING THE SAME, SEMICONDUCTOR NANOPARTICLE PHOSPHOR AND LIGHT EMITTING ELEMENT CONTAINING SEMICONDUCTOR NANOPARTICLE PHOSPHOR, WAVELENGTH CONVERTER AND LIGHT EMITTING DEVICE

(71) Applicant: Sharp Kabushiki Kaisha, Osaka-shi, Osaka (JP)

(72) Inventors: Mami Morishita, Osaka (JP); Tatsuya Ryohwa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/692,924

(22) Filed: Apr. 22, 2015

(65) Prior Publication Data
US 2015/0315463 A1 Nov. 5, 2015

(30) Foreign Application Priority Data

Apr. 30, 2014 (JP) ................................. 2014-093538
Nov. 27, 2014 (JP) ................................. 2014-240002
Dec. 4, 2014 (JP) ................................. 2014-245801

(51) Int. Cl.
*C09K 11/70* (2006.01)
*C09K 11/62* (2006.01)
*H01L 33/50* (2010.01)

(52) U.S. Cl.
CPC .............. *C09K 11/703* (2013.01); *C09K 11/62* (2013.01); *C09K 11/621* (2013.01); *C09K 11/623* (2013.01); *C09K 11/701* (2013.01); *H01L 33/502* (2013.01)

(58) Field of Classification Search
None
See application file for complete search history.

(56) References Cited

U.S. PATENT DOCUMENTS

| 8,552,417 | B2* | 10/2013 | Taylor | B82Y 30/00 257/13 |
| 2004/0072427 | A1* | 4/2004 | Sato | B82Y 30/00 438/689 |
| 2005/0051771 | A1* | 3/2005 | Sato | B82Y 30/00 257/40 |
| 2005/0170530 | A1* | 8/2005 | Sato | C09K 11/565 438/1 |
| 2007/0087197 | A1* | 4/2007 | Jang | B82Y 20/00 428/403 |

(Continued)

FOREIGN PATENT DOCUMENTS

| JP | 2004-051863 A | 2/2004 |
| JP | 2005-103746 A | 4/2005 |
| WO | 2011/081037 A1 | 7/2011 |

OTHER PUBLICATIONS

Bera, Debasis, Lei Qian, Teng-Kuan Tseng, and Paul H. Holloway. "Quantum Dots and Their Multimodal Applications: A Review." Materials 3.4 (2010): 2260-345.*

*Primary Examiner* — Joseph Schoenholtz
(74) *Attorney, Agent, or Firm* — Keating & Bennett, LLP

(57) ABSTRACT

A nanoparticle phosphor includes a nanoparticle composed of a compound semiconductor containing a first metal atom, and an inorganic substance layer provided on at least a part of the surface of the nanoparticle and containing the first metal atom and one or more kinds of hetero atoms. In the inorganic substance layer, the first metal atom is bound to the hetero atom.

12 Claims, 11 Drawing Sheets

(56) References Cited

U.S. PATENT DOCUMENTS

| | | | | |
|---|---|---|---|---|
| 2010/0163798 A1* | 7/2010 | Ryowa | ............... | C09K 11/02 252/301.4 R |
| 2011/0017951 A1* | 1/2011 | Ryowa | ............... | C09K 11/02 252/301.16 |
| 2012/0301971 A1 | 11/2012 | Murase et al. | | |
| 2014/0326949 A1* | 11/2014 | Xu | ............... | C09K 11/02 257/13 |
| 2015/0179900 A1* | 6/2015 | Pickett | ............... | C09K 11/02 438/763 |
| 2015/0200035 A1* | 7/2015 | Lee | ............... | C04B 35/62805 252/519.4 |

* cited by examiner

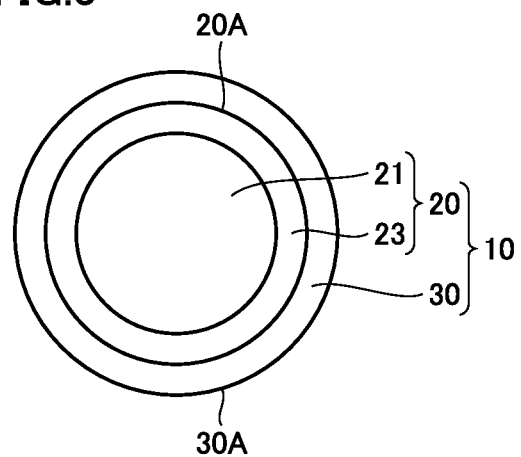
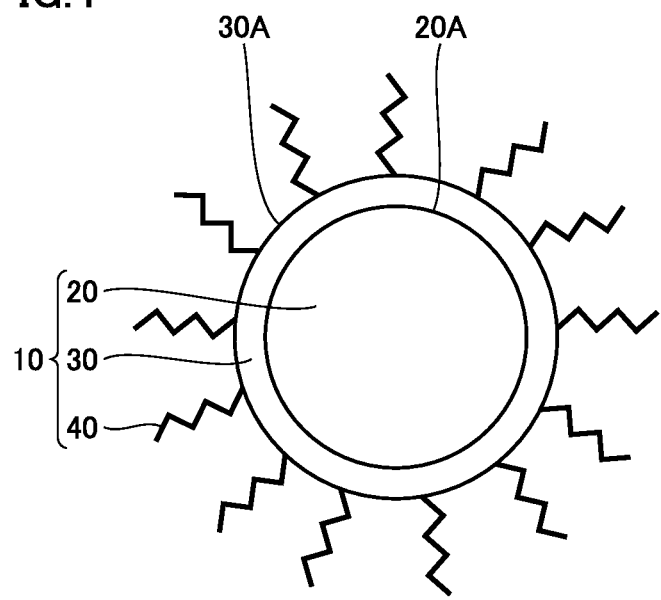

ately the Bohr radius, can no longer move freely,
NANOPARTICLE PHOSPHOR AND METHOD FOR MANUFACTURING THE SAME, SEMICONDUCTOR NANOPARTICLE PHOSPHOR AND LIGHT EMITTING ELEMENT CONTAINING SEMICONDUCTOR NANOPARTICLE PHOSPHOR, WAVELENGTH CONVERTER AND LIGHT EMITTING DEVICE This nonprovisional application is based on Japanese Patent Application No. 2014-093538 filed on Apr. 30, 2014, No. 2014-240002 filed on Nov. 27, 2014, and No. 2014-245801 filed on Dec. 4, 2014, with the Japan Patent Office, the entire contents of which are hereby incorporated by reference.

BACKGROUND OF THE INVENTION

1. Field of the Invention

The present invention relates to a nanoparticle phosphor and a method for manufacturing the same, a semiconductor nanoparticle phosphor and a light emitting element containing a semiconductor nanoparticle phosphor, a wavelength converter and a light emitting device.

2. Description of the Background Art

<First Background Art>

It has been known that when an average particle size of crystal particles composed of a compound semiconductor is made to be approximately the Bohr radius, a quantum size effect is exhibited. The quantum size effect refers to the property of electrons in a substance, when made to be approximately the Bohr radius, can no longer move freely, and the energy of the electrons in such a state is not arbitrary and only a specific value can be obtained. It has been proposed that a nanoparticle composed of a compound semiconductor (hereinafter, simply referred to as "nanoparticle") is used as a phosphor utilizing the quantum size effect. For example, this nanoparticle has a particle size of around the Bohr radius, and has a property that as the size of the particle becomes smaller, a wavelength of light generated is shifted to a shorter wavelength side. This nanoparticle also has a property that as the size distribution of the particle becomes narrower, the full width at half maximum of the fluorescence spectrum of the particle becomes narrower, and color purity becomes higher (quantum size effect). For this reason, when two or more kinds of nanoparticles (phosphors) each having a different particle size are used, if the particle size distribution of each nanoparticle is narrow, it is possible to create various fluorescent colors.

However, when the crystallinity of the nanoparticle or the surface state of the nanoparticle is not good, an exciton may undergo non-radiative relaxation (inactivation). When an exciton undergoes non-radiative relaxation, the light emission property of the nanoparticle is degraded. Accordingly, it is required to suppress generation of non-radiative relaxation of an exciton.

It is considered that the energy level at which non-radiative relaxation of an exciton is generated mainly exists at a crystal defect site on the surface of the nanoparticle. For this reason, as a method for suppressing the generation of non-radiative relaxation of an exciton, it has been proposed that the surface of a core particle composed of a compound semiconductor is covered with a semiconductor material having a band gap energy greater than that of the compound semiconductor and having no band gap in a forbidden band of the compound semiconductor. In Japanese Patent Laying-Open No. 2004-51863, there has been proposed that a modifying group having a specified chemical structure is bound to the surface of the nanoparticle.

<Second Background Art>

It has been known that when a semiconductor nanoparticle is reduced to a size approximately as small as an exciton Bohr radius, a quantum size effect is exhibited. The quantum size effect refers to the property of electrons in a substance, when reduced in size, can no longer move freely, and the energy of the electrons is not arbitrary and only a specific value can be obtained. It has been known that, by changing the size of a semiconductor nanoparticle confining electrons, the energy state of the electrons is also changed, and as a dimension becomes smaller, the wavelength of light generated from the semiconductor nanoparticle becomes shorter as the size becomes smaller. The semiconductor nanoparticle exhibiting such a quantum size effect has drawn attention for utility as a phosphor, and research thereof has progressed.

In the fluorescence mechanism of a semiconductor nanoparticle phosphor, there is entirely another fluorescence mechanism by which fluorescence is considered to be generated from an energy level existing in a forbidden band of an energy level in the interior of the semiconductor nanoparticle, in addition to band gap fluorescence exhibited by the interior of the semiconductor nanoparticle. The former is fluorescence, the wavelength of which can be controlled by the particle size of the semiconductor nanoparticle. On the other hand, it is considered that the latter energy level generating fluorescence exists mainly at the surface site of the semiconductor nanoparticle. The energy level becomes a phenomenon of inhibiting the nature of the semiconductor nanoparticle having a narrow full width at half maximum, and it has been considered to be a problem to be solved.

In order to solve this problem, there has been proposed a technique of suppressing degradation in light emission efficiency due to a defect on a semiconductor nanoparticle surface, by forming, on the surface of the semiconductor nanoparticle, a covering layer composed of a substance having a band gap greater than a band gap possessed by the semiconductor nanoparticle and having no band gap in a forbidden band of the semiconductor nanoparticle.

Japanese Patent Laying-Open No. 2005-103746 discloses, as shown in FIG. 13, a technique of attaining high light emission property by arranging a layer 265 containing an electron donating group on the surface of a semiconductor nanoparticle 262, and further, imparting durability to an external factor by further covering the layer 265 with an organic substance layer 266.

<Third Background Art>

It has been known that when a semiconductor nanoparticle is reduced to a size approximately as small as an exciton Bohr radius, a quantum size effect is exhibited. The quantum size effect refers to the property of electrons in a substance, when reduced in size, can no longer move freely, and the energy of the electrons is not arbitrary and only a specific value can be obtained. It has been known that, by changing the size of a semiconductor nanoparticle confining electrons, the energy state of the electrons is also changed, and as a dimension becomes smaller, the wavelength of light generated from the semiconductor nanoparticle becomes shorter as the size becomes smaller. The semiconductor nanoparticle exhibiting such a quantum size effect has drawn attention for utility as a phosphor, and research thereof has progressed.

Since the semiconductor nanoparticle exhibiting the quantum size effect has a small average particle size of less than or equal to 100 nm, it has a great specific surface area. For this reason, when the surface of the semiconductor nanoparticle undergoes influence of oxidation or the like, the chemical stability of the whole semiconductor nanoparticle is damaged, which greatly influences the light emission intensity of a phosphor. Since the semiconductor nanoparticle has a high surface activity, it easily aggregates in a solution.

Then, in order to improve the chemical stability of the semiconductor nanoparticle and to prevent aggregation of the semiconductor nanoparticles, there has been proposed a technique of protecting the semiconductor nanoparticle by binding, for example, the surface modifying molecule such as trioctylphosphine oxide (TOPO) to the surface of the semiconductor nanoparticle.

When a phosphor composed of the semiconductor nanoparticle is used in a wavelength converter of a light emitting device, it is generally required to disperse the phosphor in a solid layer of a resin or the like. However, when the semiconductor nanoparticle having a surface modifying molecule contacts with a resin, the surface state of the semiconductor nanoparticle is changed, and aggregation is generated. For this reason, there is a problem that the light emission efficiency of the phosphor containing the semiconductor nanoparticle is degraded.

Then, International Publication WO 2011/081037 has proposed a technique of covering the surface of a semiconductor nanoparticle with a hydrolysate of metal alkoxide.

SUMMARY OF THE INVENTION

<Summary of the Invention to First Background Art>

In order to cover the surface of a core particle with the semiconductor material at a uniform thickness, a high technique is necessary. When the thickness of a layer composed of the semiconductor material becomes ununiform on the surface of the core particle, a strain is generated at the interface between the core particle and the layer composed of the semiconductor material, and as a result, generation of non-radiative relaxation of an exciton may be caused.

According to the method described in Japanese Patent Laying-Open No. 2004-51863, the modifying groups are not bound with each other. For this reason, the modifying group may be removed from the surface of the nanoparticle due to an external factor or the like, and as a result, generation of non-radiative relaxation of an exciton may be caused.

The present invention has been made in view of the circumstances, and an object thereof is to enhance the light emission property of a nanoparticle phosphor, and to provide a method for manufacturing a nanoparticle phosphor having high light emission property.

The nanoparticle phosphor of the present invention includes a nanoparticle composed of a compound semiconductor containing a first metal atom, and an inorganic substance layer provided on at least a part of the surface of the nanoparticle and containing the first metal atom and one or more kinds of hetero atoms. In the inorganic substance layer, the first metal atom is bound to the hetero atom.

In the inorganic substance layer, the first metal atom is preferably arranged on the surface side of the nanoparticle. The inorganic substance layer preferably contains a compound having a band gap energy greater than that of the compound semiconductor.

The inorganic substance layer preferably has a first inorganic substance layer containing the first metal atom and a first hetero atom, and a second inorganic substance layer containing the first metal atom and a second hetero atom. The first inorganic substance layer and the second inorganic substance layer are preferably provided on the surface of the nanoparticle, respectively.

The nanoparticle phosphor further preferably includes a modifying organic compound bound to the surface of the inorganic substance layer. The nanoparticle phosphor further preferably contains an ultraviolet absorbing layer provided on at least a part of the surface of the inorganic substance layer. The nanoparticle preferably has a nanoparticle core composed of the compound semiconductor and a shell layer covering the nanoparticle core.

A method for manufacturing a nanoparticle phosphor includes the steps of: preparing a nanoparticle composed of a compound semiconductor containing a first metal atom; surface-treating the nanoparticle; and supplying a raw material of a hetero atom to the nanoparticle. The supply step is conducted after the surface treatment step or simultaneously with the surface treatment step.

<Summary of the Invention to Second Background Art>

However, in the technique for forming the covering layer on the surface of the semiconductor nanoparticle, a high technique for forming the covering layer uniformly is required. When the covering layer cannot be formed uniformly on the surface of the semiconductor nanoparticle, suppression of elimination of an element having high vapor pressure from the surface of the semiconductor nanoparticle, suppression of exciton relaxation due to a defect site existing on the surface, and the effect of preventing deterioration due to an external factor cannot be sufficiently exerted. Further, there is a problem that lattice mismatch between the semiconductor nanoparticle and the covering layer causes a strain on the surface of the semiconductor nanoparticle phosphor, and deteriorates light emission property.

According to the technique of Japanese Patent Laying-Open No. 2005-103746, since the layer containing an electron donating group is formed, after the semiconductor nanoparticle is prepared, by subjecting the surface of the semiconductor nanoparticle to OH coating or ammonia treatment, a metal element constituting the layer containing an electron donating group is the same as a metal element constituting the semiconductor nanoparticle. For this reason, there is a problem that, as a layer covering the semiconductor nanoparticle, composition having high quantum confinement effect cannot be selected.

Therefore, an object of the present invention is to provide a semiconductor nanoparticle phosphor capable of maintaining high light emission efficiency by arranging, outside a semiconductor nanoparticle, the surface region having composition with high quantum confinement effect and containing two or more kinds of bonds, and a light emitting element containing the semiconductor nanoparticle phosphor.

The present invention provides a semiconductor nanoparticle phosphor containing a semiconductor nanoparticle containing a first metal atom M21 and a first non-metal atom Y20, and a second metal atom M22 binding to at least a part of first non-metal atom Y20 existing on the surface of the semiconductor nanoparticle.

In the semiconductor nanoparticle phosphor of the present invention, the semiconductor nanoparticle phosphor further preferably contains a second non-metal atom Z20 binding to at least a part of first metal atom M21 existing on the surface of the semiconductor nanoparticle.

In the semiconductor nanoparticle phosphor of the present invention, second metal atom M22 is preferably bound to second non-metal atom Z20.

In the semiconductor nanoparticle phosphor of the present invention, first metal atom M21, first non-metal atom Y20 and second metal atom M22 preferably form the surface region containing two or more kinds of bonds on the surface of the semiconductor nanoparticle, and the semiconductor nanoparticle phosphor contains an inorganic crystal outside the surface region.

The present invention provides a light emitting element containing a transparent member and any of the aforementioned semiconductor nanoparticle phosphors dispersed in the transparent member.

<Summary of the Invention to Third Background Art>

According to the technique of International Publication WO 2011/081037, in order to attach metal alkoxide to the surface of the semiconductor nanoparticle, the surface modifying molecule existing on the surface of the semiconductor nanoparticle is substituted with metal alkoxide. Although the surface modifying molecule is peeled at a part of the surface of the semiconductor nanoparticle during substitution reaction, there is a possibility that a place with no metal alkoxide attached thereto is generated. This may cause a defect on the surface of the semiconductor nanoparticle, to thereby degrade the light emission efficiency of the semiconductor nanoparticle phosphor.

An object of the present invention is to provide a semiconductor nanoparticle phosphor dispersed in a sealing resin well and excellent in light emission efficiency, a wavelength converter containing the semiconductor nanoparticle phosphor, and a light emitting device.

(1) The present invention provides a semiconductor nanoparticle phosphor including a semiconductor nanoparticle containing a first non-metal atom N31 and a first metal atom M31, a metal fatty acid salt binding to first non-metal atom N31, and an organic compound containing a functional group having hetero atoms on both ends, which binds to first metal atom M31.

(2) In the semiconductor nanoparticle phosphor according to the present invention, first metal atom M31 and a second metal atom M32 contained in the metal fatty acid salt are preferably the same elements.

(3) In the semiconductor nanoparticle phosphor according to the present invention, the semiconductor nanoparticle contains a semiconductor core and a shell layer covering the semiconductor core, and the shell layer contains first non-metal atom N31 and first metal atom M31.

(4) The present invention provides a wavelength converter including the semiconductor nanoparticle phosphor of any one of (1) to (3) above and an acrylic resin, wherein the semiconductor nanoparticle is sealed in the acrylic resin.

(5) The present invention provides a light emitting device including the wavelength converter of (4) above and an excitation light source.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a cross-sectional view of a nanoparticle phosphor in one embodiment of the present invention.

FIG. 4 is a cross-sectional view of a nanoparticle phosphor in one embodiment of the present invention.

DESCRIPTION OF THE PREFERRED EMBODIMENTS

Figure 1:
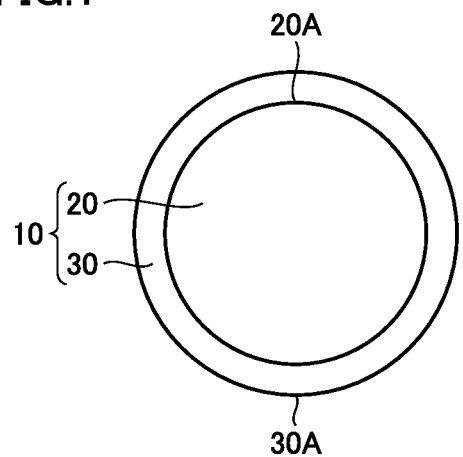
FIG. 1 is a cross-sectional view of a nanoparticle phosphor in one embodiment of the present invention.

The present invention will be described below with reference to the drawings. In the drawings of the present invention, the same or equivalent elements are designated using the same reference numerals. The dimensions, such as length, width, thickness, and depth, are appropriately changed for the clarification and simplification of the drawings and do not express the actual dimensions.

[First Embodiment]

[Constitution of Nanoparticle Phosphor]

FIG. 1 is a cross-sectional view of a nanoparticle phosphor in a first embodiment of the present invention. A nanoparticle phosphor 10 includes a nanoparticle 20 and an inorganic substance layer 30. Nanoparticle 20 is composed of a compound semiconductor containing a first metal atom. Inorganic substance layer 30 is provided on the surface 20A of nanoparticle 20, and contains the first metal and one or more kinds of hetero atoms. In inorganic substance layer 30, the first metal atom is bound to the one or more kinds of hetero atoms (FIG. 2 right side).

Figure 2:
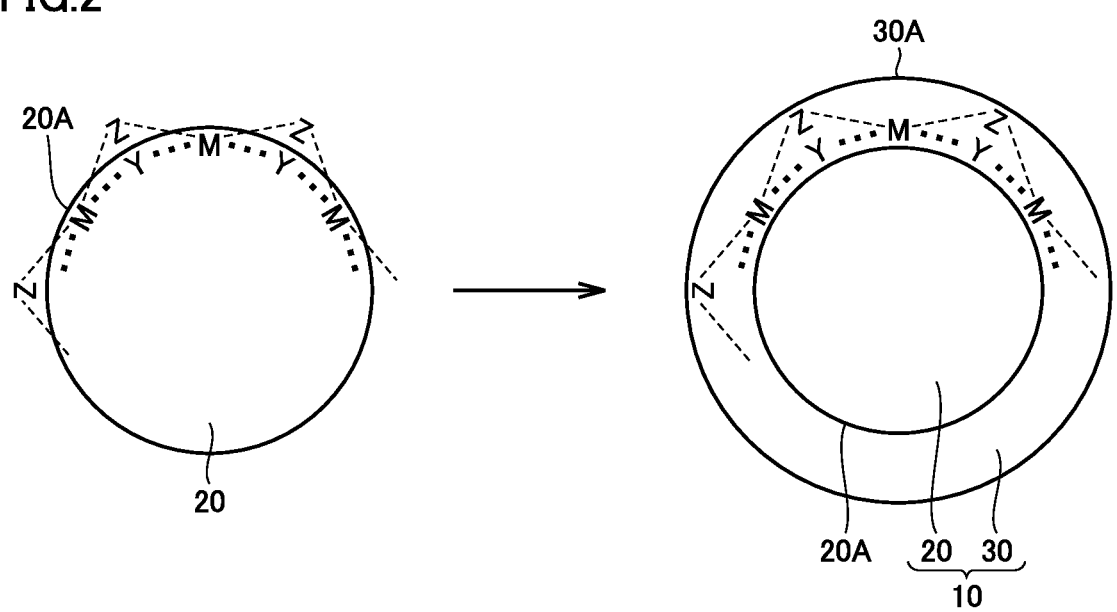
FIG. 2 is a cross-sectional view showing a manufacturing process of the nanoparticle phosphor in one embodiment of the present invention.

FIG. 2 is a cross-sectional view schematically showing a manufacturing process of nanoparticle phosphor 10. In FIG. 2, M represents a first metal atom, Y represents an atom different from the first metal atom among atoms contained in nanoparticle 20, and Z represents a hetero atom. When a raw material of hetero atom Z is supplied to surface 20A of nanoparticle 20, first metal atom M positioned on the surface 20A side of nanoparticle 20 is bound to hetero atom Z. Since inorganic substance layer 30 is thus formed, it results in that inorganic substance layer 30 is provided on surface 20A of nanoparticle 20 at a uniform thickness.

Here, "inorganic substance layer 30 is provided on surface 20A of nanoparticle 20 at a uniform thickness" means that only one layer of inorganic substance layer 30 is provided on surface 20A of nanoparticle 20. "Only one layer of inorganic substance layer 30 is provided on surface 20A of nanoparticle 20" means that first metal atom M bound to hetero atom Z is only first metal atom M positioned on the surface 20A side of nanoparticle 20. That is, "only one layer of inorganic substance layer 30 is provided on surface 20A of nanoparticle 20" means that inorganic substance layer 30 has a thickness of greater than or equal to 0.01 nm and less than or equal to 3 nm.

When inorganic substance layer 30 is provided on surface 20A of nanoparticle 20 at a uniform thickness, generation of a crystal defect due to lattice mismatch at the interface between nanoparticle 20 and inorganic substance layer 30 can be prevented, and generation of a crystal strain in inorganic substance layer 30 can be prevented. This makes it possible to prevent generation of a strain at the interface between nanoparticle 20 and inorganic substance layer 30, the state of surface 20A of nanoparticle 20 can be thus retained in a good state, and accordingly, generation of non-radiative relaxation of an exciton can be prevented. Therefore, the light emission property of nanoparticle phosphor 10 can be enhanced. Here, "the light emission property of nanoparticle phosphor 10 is high" means an intensity of band gap fluorescence exhibited by the interior of nanoparticle 20 is greater than or equal to 90% relative to an intensity of light radiated from nanoparticle phosphor 10, and means that the peak wavelength of light radiated from nanoparticle phosphor 10 is consistent with the peak wavelength (theoretical value) of fluorescence to be emitted by nanoparticle 20.

Since hetero atom Z binds to first metal atom M contained in nanoparticle 20, inorganic substance layer 30 is firmly bound to surface 20A of nanoparticle 20. This makes it possible to prevent inorganic substance layer 30 from peeling from surface 20A of nanoparticle 20. Since this fact can also prevent the state of surface 20A of nanoparticle 20 from being worsened, generation of non-radiative relaxation of an exciton can be prevented, and accordingly, the light emission property of nanoparticle phosphor 10 can be enhanced.

As described above, inorganic substance layer 30 is provided on surface 20A of nanoparticle 20 at a uniform thickness, and inorganic substance layer 30 can be prevented from peeling from surface 20A of nanoparticle 20. Since this fact can also prevent the deterioration of nanoparticle 20 due to an external factor, the chemical stability of nanoparticle phosphor 10 can be also enhanced. When the above descriptions are summarized, in the present embodiment, since the light emission property and chemical stability of nanoparticle phosphor 10 can be enhanced, nanoparticle phosphor 10 can be used as a phosphor contained in an optical device such as an LED (Light Emitting Diode).

Since inorganic substance layer 30 is formed as described above, inorganic substance layer 30 can be formed without accompanying a change in an average particle size of nanoparticle 20. This makes it possible to prevent a light emission wavelength of nanoparticle 20 from changing before and after the formation of inorganic substance layer 30. Accordingly, nanoparticle phosphor 10 having a desired light emission wavelength can be conveniently provided.

Even when inorganic substance layer 30 is provided on a part of surface 20A of nanoparticle 20 at a uniform thickness, generation of a strain at the interface between nanoparticle 20 and inorganic substance layer 30 can be prevented. Accordingly, the light emission property of nanoparticle phosphor 10 can be enhanced as compared with the case where inorganic substance layer 30 is not provided on surface 20A of nanoparticle 20 at all. In addition, when inorganic substance layer 30 is provided on a part of surface 20A of nanoparticle 20 at a uniform thickness, the chemical stability of nanoparticle phosphor 10 can be enhanced as compared with the case where inorganic substance layer 30 is not provided on surface 20A of nanoparticle 20 at all. From the foregoing, when inorganic substance layer 30 is provided on at least a part of surface 20A of nanoparticle 20 at a uniform thickness, the light emission property and chemical stability of nanoparticle phosphor 10 can be enhanced as compared with the case where inorganic substance layer 30 is not provided on surface 20A of nanoparticle 20 at all.

<Nanoparticle>

Nanoparticle 20 is composed of a compound semiconductor containing a first metal atom. The "compound semiconductor" means a semiconductor constituted by binding the first metal atom and one or more kinds of atoms by covalent bond or ionic bond. The "nanoparticle" means a particle having a diameter of greater than or equal to several hundred μm and less than or equal to several tens μm. The diameter of the particle can be estimated by directly observing a lattice image of nanoparticle 20 with an observed image at high magnification, for example, using a scanning electron microscope or a transmission electron microscope.

The compound semiconductor is preferably a group 13-group 15 compound semiconductor or a group 12-group 16 compound semiconductor. The "group 13-group 15 compound semiconductor" means a semiconductor constituted by binding a group 13 element (B, Al, Ga, In, Tl) and a group 15 element (N, P, As, Sb, Bi) by ionic bond. The group 13-group 15 compound semiconductor contained in nanoparticle 20 is preferably at least one of InN, InP, InGaN, InGaP, AlInN, AlInP, AlGaInN and AlGaInP, and more preferably at least one of InN, InP, InGaN and InGaP. When the compound semiconductor is the group 13-group 15 compound semiconductor, the first metal atom is a group 13 element.

The "group 12-group 16 compound semiconductor" means a semiconductor constituted by binding a group 12 element (Zn, Cd, Hg) and a group 16 element (O, S, Se, Te) by ionic bond. The group 12-group 16 compound semiconductor contained in nanoparticle 20 is preferably at least one of ZnO, ZnS, ZnSe, ZnTe, CdS and CdSe, and more preferably at least one of ZnO, CdS and CdSe. When the compound semiconductor is the group 12-group 16 compound semiconductor, the first metal atom is a group 12 element.

The compound semiconductor has a band gap energy such that first light can be absorbed to generate second light (wavelength of second light is longer than wavelength of first light; visible light). By controlling an average particle size of nanoparticle 20 or a mixed crystal ratio in nanoparticle 20, a light emission wavelength of nanoparticle 20 can be adjusted to a wavelength of an arbitrary visible light region.

A band gap energy size of the compound semiconductor is preferably set depending on a light emission wavelength of nanoparticle phosphor 10. When used as a red phosphor, the compound semiconductor preferably has a band gap energy of greater than or equal to 1.85 eV and less than or equal to 2.5 eV; when used as a green phosphor, the compound semiconductor preferably has a band gap energy of greater than or equal to 2.3 eV and less than or equal to 2.5 eV; and when used as a blue phosphor, the compound semiconductor preferably has a band gap energy of greater than or equal to 2.65 eV and less than or equal to 2.8 eV.

Nanoparticle 20 may contain unintentional impurities, and may contain intentionally added impurities at a concentration of greater than or equal to $1\times10^{16}$ cm$^{-3}$ and less than or equal to $1\times10^{21}$ cm$^{-3}$. When impurities are intentionally added to nanoparticle 20, preferably any of group 2 elements (Be, Mg, Ca, Sr, Ba), Zn and Si is used as a dopant, and more preferably any of Mg, Zn and Si is used as a dopant.

The average particle size of nanoparticle 20 is preferably less than or equal to two times of the Bohr radius. The "Bohr radius" indicates spreading of the existence probability of an exciton, and is represented by a mathematic equation (1) below.

$$y = 4\pi\epsilon h^2 \cdot me^2 \qquad \text{Equation (1)}$$

In equation (1), y represents the Bohr radius, $\epsilon$ represents permittivity, h represents the Plank's constant, m represents an effective mass, and e represents an elementary electrical charge.

When the average particle size of nanoparticle 20 is less than or equal to two times of the Bohr radius, the light emission intensity of nanoparticle 20 becomes very great. When the average particle size of nanoparticle 20 is less than or equal to two times of the Bohr radius, there is a tendency that the band gap of the compound semiconductor will become larger by the quantum size effect. Also in this case, the band gap energy of the compound semiconductor contained in nanoparticle 20 is preferably greater than or equal to 1.8 eV and less than or equal to 2.8 eV. The average particle size of nanoparticle 20 can be estimated by directly observing a lattice image of nanoparticle 20 with an observed image at high magnification, for example, using a scanning electron microscope or a transmission electron microscope.

<Inorganic Substance Layer>

Inorganic substance layer 30 contains a first metal atom and a hetero atom. The first metal atom is the same as the first metal atom contained in nanoparticle 20. The "hetero atom" means a generic name of atoms different from carbon and hydrogen, preferably atoms different from carbon and hydrogen and except for transition elements. The hetero atom is preferably at least one of a group 15 element (e.g., nitrogen, phosphorus, arsenic or antimony), a group 16 element (e.g., oxygen, sulfur, selenium or tellurium) and a group 17 element (e.g., fluorine, chlorine, bromine or iodine).

Inorganic substance layer 30 preferably contains a compound which hardly reacts with oxygen, moisture etc. This makes it possible to prevent inorganic substance layer 30 from melting or deteriorating with oxygen, moisture etc. in the air. Accordingly, even when nanoparticle phosphor 10 contacts with the air, the light emission property of nanoparticle phosphor 10 can be prevented from degradation. For example, during manufacturing of an optical device containing nanoparticle phosphor 10, the light emission property of nanoparticle phosphor 10 can be prevented from degradation.

Inorganic substance layer 30 preferably contains a compound having a band gap energy greater than that of the compound semiconductor contained in nanoparticle 20. This makes it possible to enhance quantum efficiency, and therefore, the light emission property of nanoparticle phosphor 10 can be further enhanced.

In view of the foregoing, inorganic substance layer 30 is preferably composed of at least one of metal pnictogenide, metal chalcogenide and metal halide. The metal pnictogenide means a compound of a metal and a group 15 element, and is preferably, for example, InN, InP, InAs, InSb, InBi, GaN, GaP, GaAs, GaSb or GaBi. The metal chalcogenide means a compound of a metal and a group 16 element, and is preferably, for example, $In_2O_3$, $Ga_2O_3$, $Al_2O_3$, ZnO, CdO, $TiO_2$, $Cu_2O$, $In_2S_3$, $Ga_2S_3$, $Al_2S_3$, ZnS, CdS, $In_2Se_3$, $Ga_2Se_3$, $Al_2Se_3$, ZnSe, CdSe, $In_2Te_3$, $Ga_2Te_3$, $Al_2Te_3$, ZnTe or CdTe. The metal halide means a compound of a metal and a group 17 element, and is preferably, for example, $InCl_3$, $InBr_3$, $GaCl_3$, $GaBr_3$, $ZnCl_2$ or $ZnBr_2$.

For example, when the compound semiconductor contained in nanoparticle 20 is InN, since the first metal atom is In, inorganic substance layer 30 is composed of a compound of In and a hetero atom. When the compound semiconductor contained in nanoparticle 20 is InGaN, since the first metal atom is In and Ga, inorganic substance layer 30 is composed of at least one compound of a compound of In and a hetero atom and a compound of Ga and a hetero atom.

Inorganic substance layer 30 has a thickness of preferably greater than or equal to 0.01 nm and less than or equal to 3 nm (as described above), and more preferably greater than or equal to 0.1 nm and less than or equal to 2 nm. The thickness of inorganic substance layer 30 can be estimated by directly observing a lattice image of inorganic substance layer 30 with an observed image at high magnification, for example, using a scanning electron microscope or a transmission electron microscope.

[Manufacturing of Nanoparticle Phosphor]

The method for manufacturing nanoparticle phosphor 10 of the present embodiment includes the steps of: preparing nanoparticle 20; surface-treating nanoparticle 20; and supplying a raw material of the hetero atom to nanoparticle 20.

(Preparation Step)

In the preparation step, a nanoparticle (nanoparticle 20 as described above) composed of the compound semiconductor containing the first metal atom is prepared. Nanoparticle 20 is preferably prepared, for example, by chemical synthesis method. This makes it possible to prepare nanoparticle 20 conveniently and at low costs. Examples of the chemical synthesis method include a sol gel method (colloid method), a hot soap method, a reverse micelle method, a solvothermal method, a molecular precursor method, a hydrothermal synthesis method, a flux method etc. For example, when nanoparticle 20 composed of InN is prepared by hot soap method, after a flask is filled with 1-octadecene (solvent for synthesis), tris(dimethylamino)indium and hexadecanethiol (HDT) are added to the flask. After the resulting mixed liquid is sufficiently stirred, the materials are subjected to reaction at 180 to 500° C. Nanoparticle 20 is thus obtained. HDT is bound to surface 20A of nanoparticle 20 thus obtained.

(Surface Treatment Step)

In the surface treatment step, surface treatment is conducted on nanoparticle 20 thus prepared. This releases at least a part of binding of surface 20A of nanoparticle 20 and HDT, and therefore, the first metal atom positioned on the surface 20A side of nanoparticle 20 becomes in a reaction active state.

Here, "surface treatment" to be conducted on nanoparticle 20 thus prepared means treatment for bringing at least a bond of the first metal atom positioned on the surface 20A side of nanoparticle 20 into a free state (state where a bond of the first metal atom is not bound to the first metal atom and an atom different from the first metal atom), that is, means treatment for bringing the first metal atom positioned on the surface 20A side of nanoparticle 20 into a reaction active state. Specific examples of the "surface treatment" include oxidation, reduction, photooxidation etc. of surface 20A of nanoparticle 20.

Examples of the method for oxidizing surface 20A of nanoparticle 20 include bubbling of oxygen gas into a solution containing nanoparticle 20, heating of a solution containing nanoparticle 20 in the atmospheric air (heating temperature: 100° C. to 300° C.), supplying of an oxidizing agent to surface 20A of nanoparticle 20, etc. Examples of the method for reducing surface 20A of nanoparticle 20 include supplying of a reducing agent to surface 20A of nanoparticle 20, etc. The photooxidation means oxidation of a substance by photochemical reaction. Examples of the method for photooxidizing surface 20A of nanoparticle 20 include light irradiation to nanoparticle 20 in the atmospheric air, etc.

(Supply Step)

In the supply step, a raw material of a hetero atom is supplied to nanoparticle 20. By surface-treating nanoparticle 20, the first metal atom positioned on the surface 20A side of nanoparticle 20 has become in a reaction active state. For this reason, when a raw material of a hetero atom is supplied to nanoparticle 20, the raw material of a hetero atom supplied is bound to the first metal atom which has become in a reaction active state. Inorganic substance layer 30 is formed in this way, and accordingly, nanoparticle phosphor 10 is obtained.

Examples of the method for supplying the raw material of a hetero atom to nanoparticle 20 include an injection method, etc. As the raw material of a hetero atom, a molecule containing a hetero atom is preferably used. For example, when the hetero atom is a nitrogen atom, nitrogen can be used as the raw material of the hetero atom.

The supply step may be conducted after the surface treatment step, or may be conducted simultaneously with the surface treatment step. When the supply step is conducted simultaneously with the surface treatment step, HDT bound to surface 20A of nanoparticle 20 and the first metal atom positioned on the surface 20A side of nanoparticle 20 are preferably subjected to photoreaction. By this photoreaction, S contained in HDT is bound to the first metal atom positioned on the surface 20A side of nanoparticle 20, and accordingly, inorganic substance layer 30 is formed. Specifically, the raw material of the hetero atom is preferably supplied to nanoparticle 20, while surface 20A of nanoparticle 20 is irradiated with light.

By using TEM (Transmission Electron Microscope), XPS (X-ray Photoelectron Spectroscopy) and ICP-AES (Inductively Coupled Plasma-Atomic Emission Spectrometry), it is seen that one layer of inorganic substance layer 30 is formed on surface 20A of nanoparticle 20.

[Second Embodiment]

FIG. 3 is a cross-sectional view of a nanoparticle phosphor in a second embodiment of the present invention. In the present embodiment, nanoparticle 20 has a nanoparticle core 21 composed of a compound semiconductor, and a shell layer 23 covering nanoparticle core 21. Even in this case, the effect described in the first embodiment can be obtained. Not only this, but also nanoparticle phosphor 10 can have a wide range of utility. Points different from the first embodiment will be shown below.

<Nanoparticle>

The compound semiconductor contained in nanoparticle core 21 is preferably any of the compound semiconductors described in the first embodiment. An average particle size of nanoparticle core 21 is preferably less than or equal to two times of the Bohr radius. The average particle size of nanoparticle core 21 can be estimated by directly observing a lattice image of nanoparticle core 21 with an observed image at high magnification, for example, using a scanning electron microscope or a transmission electron microscope.

<Shell Layer>

Shell layer 23 is preferably a compound semiconductor layer formed by inheriting the crystal structure of nanoparticle core 21, and more preferably a compound semiconductor layer obtained by crystal growth on the surface of nanoparticle core 21 using nanoparticle core 21 as a nucleus of growth. For example, an element having an uncombined bond is arranged on the surface of nanoparticle core 21, and an element contained in shell layer 23 is chemically bound to the uncombined bond.

The compound semiconductor contained in shell layer 23 is preferably a group 13-group 15 compound semiconductor or a group 12-group 16 compound semiconductor. The group 13-group 15 compound semiconductor is preferably any of the group 13-group 15 compound semiconductors described in the first embodiment, and the group 12-group 16 compound semiconductor is preferably any of the group 12-group 16 compound semiconductors described in the first embodiment.

Examples of nanoparticle 20 in the present embodiment include InP/GaP, InN/GaN, CdSe/CdS etc. (all are a material of nanoparticle core 21/a material of shell layer 23). Since a material of nanoparticle core 21 is different from a material of shell layer 23 in this way, the kind of the first metal atom positioned on the surface 20A side of nanoparticle 20 can be changed by changing the material of shell layer 23. This makes it possible to select, as a material of inorganic substance layer 30, a material suitable for each utility of nanoparticle phosphor 10 among more kinds of materials. Accordingly, nanoparticle phosphor 10 can have a wide range of utility.

A thickness of shell layer 23 is preferably determined depending on an average particle size of nanoparticle core 21. For example, when the average particle size of nanoparticle core 21 is estimated to be 2 to 6 nm, shell layer 23 preferably has a thickness of 0.1 nm to 10 nm. The thickness of shell layer 23 can be estimated by directly observing a lattice image of shell layer 23 with an observed image at high magnification, for example, using a scanning electron microscope or a transmission electron microscope.

Nanoparticle 20 of the present embodiment can be prepared according to the method shown below. First, nanoparticle core 21 is prepared according to the method for preparing nanoparticle 20 described in the first embodiment. Then, a reaction reagent serving a raw material of shell layer 23 is added to a solution containing nanoparticle core 21 to conduct thermal reaction. Nanoparticle 20 of the present embodiment is thus obtained.

[Third Embodiment]

FIG. 4 is a cross-sectional view of a nanoparticle phosphor in a third embodiment of the present invention. In the present embodiment, a modifying organic compound 40 is bound to the surface 30A of inorganic substance layer 30. Even in this case, the effect described in the first embodiment can be obtained. Not only this, but also the dispersibility of nanoparticle phosphor 10 can be enhanced, and therefore, the light emission property of nanoparticle phosphor 10 can be further enhanced. Points different from the first embodiment will be shown below.

<Modifying Organic Compound>

A chemical structure of modifying organic compound 40 is not particularly limited, but a length of modifying organic compound 40 in the radius direction of nanoparticle phosphor 10 is preferably greater than or equal to 0.1 nm and less than or equal to 5 nm. This makes it possible to prevent nanoparticle phosphors 10 from aggregation with each other, and therefore, the dispersibility of nanoparticle phosphor 10 can be enhanced. Accordingly, a distance between nanoparticles 20 can be sufficiently and greatly retained. Since generation of charge transfer between nanoparticles 20 can be prevented, generation of non-radiative relaxation of an exciton due to the charge transfer can be prevented. As a result, the light emission property of nanoparticle phosphor 10 can be enhanced more than the first embodiment.

As such modifying organic compound 40, for example, hexadecanethiol, hexadecylamine, oleic acid, oleylamine, or thioglycolic acid can be used.

Then, nanoparticle phosphor 10 of the present embodiment can be manufactured according to the method shown below. First, according to the method for preparing nanoparticle phosphor 10 described in the first embodiment, a particle including inorganic substance layer 30 provided on surface 20A of nanoparticle 20 is prepared. Then, modifying organic compound 40 is added to a solution containing this particle to cause reaction at room temperature to 300° C. Nanoparticle phosphor 10 of the present embodiment is thus obtained.

[Fourth Embodiment]

Figure 5:
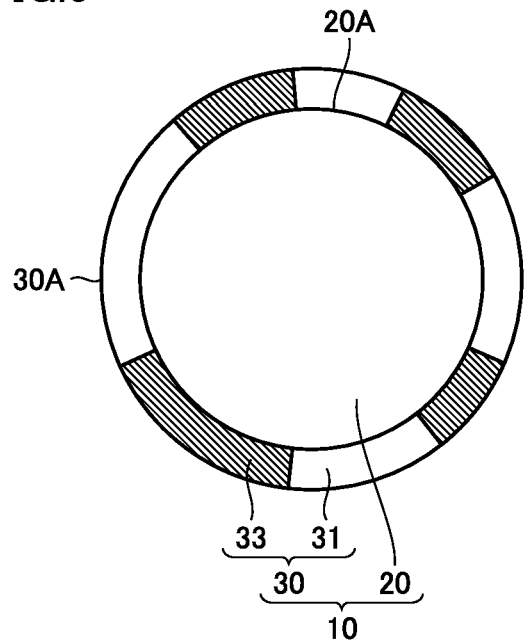
FIG. 5 is a cross-sectional view of a nanoparticle phosphor in one embodiment of the present invention.

FIG. 5 is a cross-sectional view of a nanoparticle phosphor in a fourth embodiment of the present invention. In the present embodiment, inorganic substance layer 30 has a first inorganic substance layer 31 and a second inorganic substance layer 33. First inorganic substance layer 31 contains a first metal atom and a first hetero atom, and is provided on surface 20A of nanoparticle 20. Second inorganic substance layer 33 contains the first metal atom and a second hetero atom, and is provided on surface 20A of nanoparticle 20. Even in this case, the effect described in the first embodiment can be obtained. Not only this, but also the chemical stability of nanoparticle phosphor 10 can be further enhanced, or the dispersibility of nanoparticle phosphor 10 can be enhanced. Points different from the first embodiment will be shown below.

The first hetero atom is preferably any of the hetero atoms described in the first embodiment. The second hetero atom is preferably any of the hetero atoms described in the first embodiment, and is preferably an atom different from the first hetero atom.

When inorganic substance layer 30 has first inorganic substance layer 31 and second inorganic substance layer 33 in this way, the effect which is hardly obtained only by formation of first inorganic substance layer 31 can be obtained by formation of second inorganic substance layer 33, and the effect which is hardly obtained only by formation of second inorganic substance layer 33 can be obtained by formation of first inorganic substance layer 31.

For example, the case is considered where first inorganic substance layer 31 can prevent deterioration of nanoparticle 20 due to a first external factor, but cannot prevent deterioration of nanoparticle 20 due to a second external factor. If second inorganic substance layer 33 can prevent the deterioration of nanoparticle 20 due to a second external factor, when second inorganic substance layer 33 is formed together with first inorganic substance layer 31, the deterioration of nanoparticle 20 due to a first external factor and a second external factor can be prevented. This makes it possible to further enhance the chemical stability of nanoparticle phosphor 10.

When modifying organic compound 40 is hardly bound to the surface of first inorganic substance layer 31, if modifying organic compound 40 is easily bound to the surface of second inorganic substance layer 33, the dispersibility of nanoparticle phosphor 10 can be enhanced if second inorganic substance layer 33 is formed together with first inorganic substance layer 31.

Furthermore, when a first modifying organic compound is easily bound to the surface of first inorganic substance layer 31, and a second modifying organic compound is easily bound to the surface of second inorganic substance layer 33, nanoparticle phosphor 10 can be dispersed in a plurality of solvents. This makes it possible to prevent a use form of nanoparticle phosphor 10 from being limited.

An arrangement form of first inorganic substance layer 31 and second inorganic substance layer 33 on surface 20A of nanoparticle 20 is not particularly limited. For example, first inorganic substance layer 31 and second inorganic substance layer 33 may be contacted to each other on surface 20A of nanoparticle 20 (FIG. 5). One first inorganic substance layer 31 and one second inorganic substance layer 33 are provided on surface 20A of nanoparticle 20, and one first inorganic substance layer 31 and one second inorganic substance layer 33 may be contacted to each other on surface 20A of nanoparticle 20. An occupying percentage of first inorganic substance layer 31 on surface 20A of nanoparticle 20 is not particularly limited, but may be 50%, may be less than 50%, or may be more than 50%.

Nanoparticle phosphor 10 of the present embodiment can be manufactured according to the method shown below. First, nanoparticle 20 is prepared according to the method described in the first embodiment. Then, a raw material of the first hetero atom is supplied to nanoparticle 20 at such an amount that a part of surface 20A of nanoparticle 20 can be covered, and the first hetero atom is caused to react with the first metal atom positioned on the surface 20A side of nanoparticle 20. Accordingly, first inorganic substance layer 31 is formed on a part of surface 20A of nanoparticle 20. Subsequently, a raw material of the second hetero atom is supplied to nanoparticle 20 at such an amount that at least a part of a portion can be covered where first inorganic substance layer 31 has not been formed (exposed portion of surface 20A of nanoparticle 20) in surface 20A of nanoparticle 20, and the second hetero atom is caused to reaction with the first metal atom positioned on the surface 20A side of nanoparticle 20. Accordingly, second inorganic substance layer 33 is formed on at least a part of an exposed portion of surface 20A of nanoparticle 20. Nanoparticle phosphor 10 of the present embodiment is thus obtained.

In the present embodiment, nanoparticle 20 of the second embodiment may be used as nanoparticle 20. This also applies to fourth and fifth embodiments described later. Inorganic substance layer 30 may have three or more kinds of inorganic substance layers. As the kinds of the inorganic substance layer increase, the chemical stability and dispersibility of nanoparticle phosphor 10 can be still further enhanced, and the use form of nanoparticle phosphor 10 can be prevented from being limited.

[Fifth Embodiment]

Figure 6:
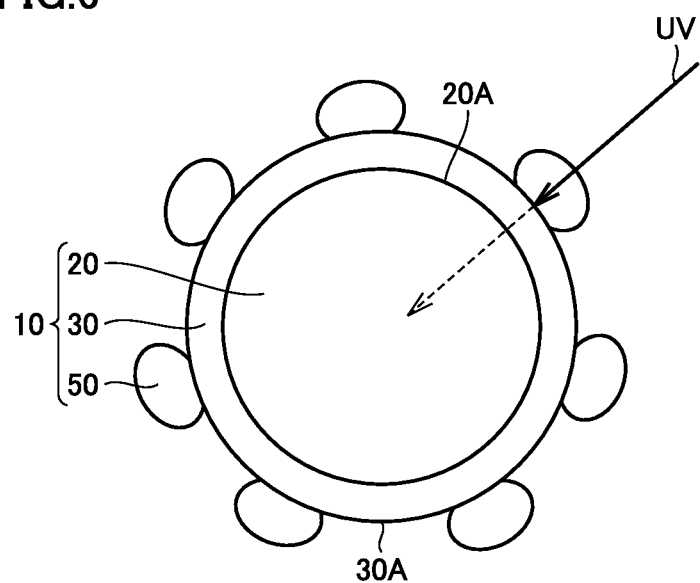
FIG. 6 is a cross-sectional view of a nanoparticle phosphor in one embodiment of the present invention.

FIG. 6 is a cross-sectional view of a nanoparticle phosphor in a fifth embodiment of the present invention. In the present embodiment, an ultraviolet absorbing layer 50 is provided on at least a part of the surface 30A of inorganic substance layer 30. Even in this case, the effect described in the first embodiment can be obtained. Not only this, but also the deterioration of nanoparticle 20 due to ultraviolet rays can be prevented. Points different from the first embodiment will be shown below.

<Ultraviolet Absorbing Layer>

Ultraviolet absorbing layer 50 preferably contains a compound having absorption only in a wavelength region of at least a part of a wavelength region of greater than or equal to 300 nm and less than or equal to 400 nm. As the compound, for example, a wide gap semiconductor such as ZnS, ZnO, $TiO_2$, $ZrO_2$, ZnO:Mg, ZnO:Be or GaN, or an inorganic phosphor such as $YVO_4$ can be used.

According to the method shown below, nanoparticle phosphor 10 of the present embodiment can be manufactured.

First, according to the method described in the first embodiment, a particle including inorganic substance layer 30 provided on surface 20A of nanoparticle 20 is prepared. Thereafter, a raw material of ultraviolet absorbing layer 50 is added to cause reaction of the material at room temperature to 500° C. Nanoparticle phosphor 10 of the present embodiment is thus obtained.

In the present embodiment, inorganic substance layer 30 of the fourth embodiment may be used as inorganic substance layer 30. Modifying organic compound 40 of the third embodiment may be bound to surface 30A of inorganic substance layer 30.

[Sixth Embodiment]

Figure 7:
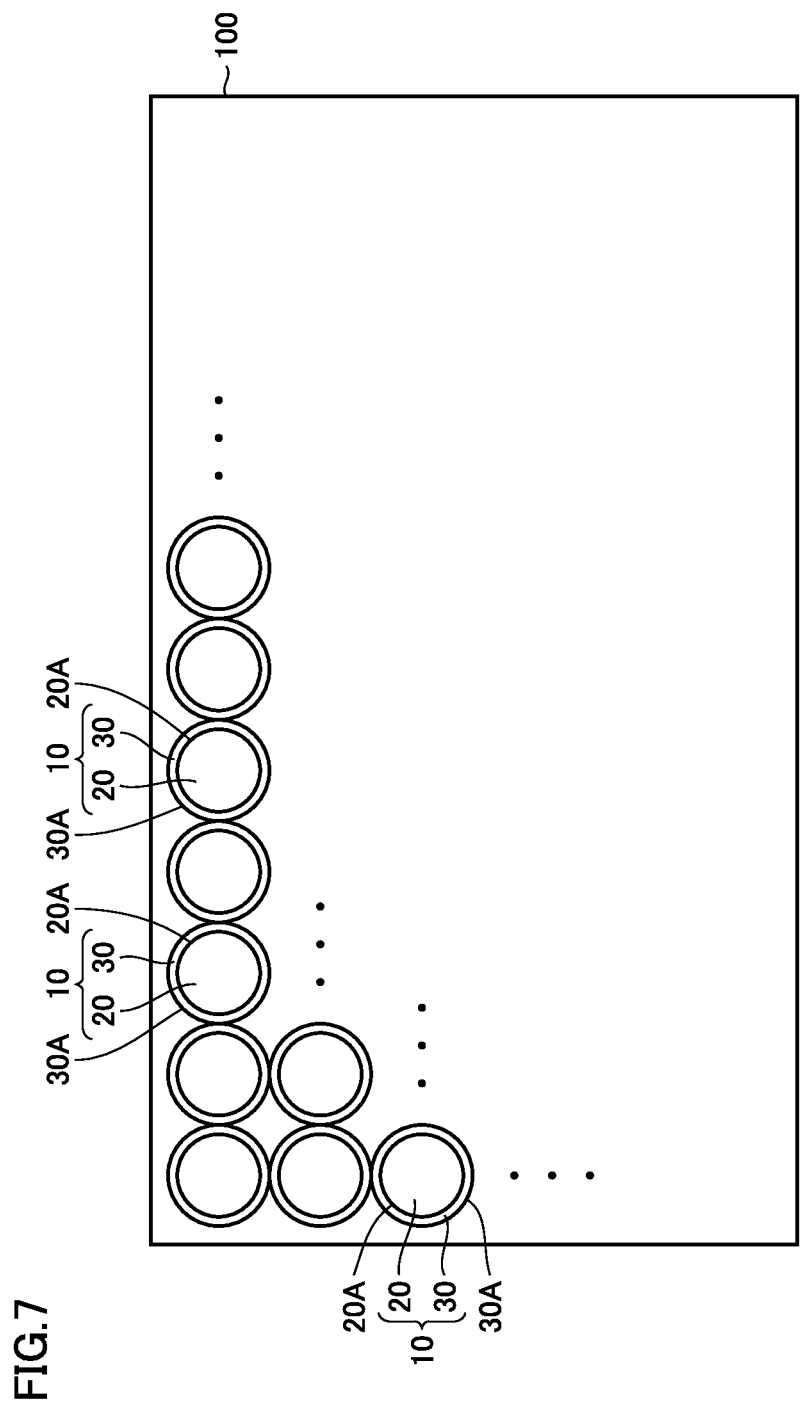
FIG. 7 is a cross-sectional view showing a use form of a nanoparticle phosphor in one embodiment of the present invention.

FIG. 7 is a cross-sectional view showing a use form of a nanoparticle phosphor in a sixth embodiment of the present invention. In the present embodiment, nanoparticle phosphors 10 of the first embodiment are most closely packed in a sheet-like member 100. In nanoparticle phosphor 10, inorganic substance layer 30 is provided on surface 20A of nanoparticle 20. For this reason, nanoparticles 20 can be prevented from being contacted to each other. Accordingly, since generation of charge transfer between nanoparticles 20 can be prevented, generation of non-radiative relaxation of an exciton due to the charge transfer can be prevented. Therefore, nanoparticle phosphor 10 can be arranged in sheet-like member 100 at a high density. From the foregoing, when nanoparticle phosphor 10 is used, an optical device excellent in optical intensity can be provided.

As nanoparticle phosphor 10 to be packed in sheet-like member 100, any of nanoparticle phosphors 10 of the first to fifth embodiments may be used. A use form of nanoparticle phosphor 10 is not limited to the form described in the present embodiment, and for example, nanoparticle phosphor 10 may be used by dispersing nanoparticle phosphor 10 in a solution. In this case, nanoparticle phosphor 10 of the third embodiment is preferably used as nanoparticle phosphor 10.

As described above, nanoparticle phosphor 10 shown in FIG. 1 or the like includes nanoparticle 20 composed of the compound semiconductor containing the first metal atom, and inorganic substance layer 30 provided on at least a part of surface 20A of nanoparticle 20 and containing the first metal atom and one or more kinds of hetero atoms. In inorganic substance layer 30, the first metal atom is bound to the hetero atom. This makes it possible to enhance the light emission property of nanoparticle phosphor 10.

In inorganic substance layer 30, the first metal atom is preferably arranged on the surface 20A side of nanoparticle 20.

Inorganic substance layer 30 preferably contains a compound having a band gap energy greater than that of the compound semiconductor. This makes it possible to further enhance the light emission property of nanoparticle phosphor 10.

Nanoparticle phosphor 10 further includes modifying organic compound 40 bound to surface 30A of inorganic substance layer 30. This makes it possible to enhance the dispersibility of nanoparticle phosphor 10.

Inorganic substance layer 30 preferably has first inorganic substance layer 31 containing a first metal atom and a first hetero atom, and second inorganic substance layer 33 containing the first metal atom and a second hetero atom. First inorganic substance layer 31 and second inorganic substance layer 33 are preferably provided on surface 20A of nanoparticle 20, respectively. This makes it possible to further enhance the chemical stability of nanoparticle phosphor 10. Alternatively, the dispersibility of nanoparticle phosphor 10 can be enhanced.

Nanoparticle phosphor 10 further contains ultraviolet absorbing layer 50 provided on at least a part of surface 30A of inorganic substance layer 30. This makes it possible to prevent the deterioration of nanoparticle 20 due to irradiation of ultraviolet rays.

Nanoparticle 20 has nanoparticle core 21 composed of the compound semiconductor, and a shell layer 23 covering nanoparticle core 21.

The method for manufacturing nanoparticle phosphor 10 includes the steps of: preparing nanoparticle 20 composed of the compound semiconductor containing the first metal atom; surface-treating nanoparticle 20; and supplying a raw material of the hetero atom to nanoparticle 20. The supply step is conducted after the surface treatment step, or simultaneously with the surface treatment step.

[Embodiment 2-1]

<Semiconductor Nanoparticle Phosphor>

A semiconductor nanoparticle phosphor in Embodiment 2-1 will be described with reference to FIG. 8.

Figure 8:
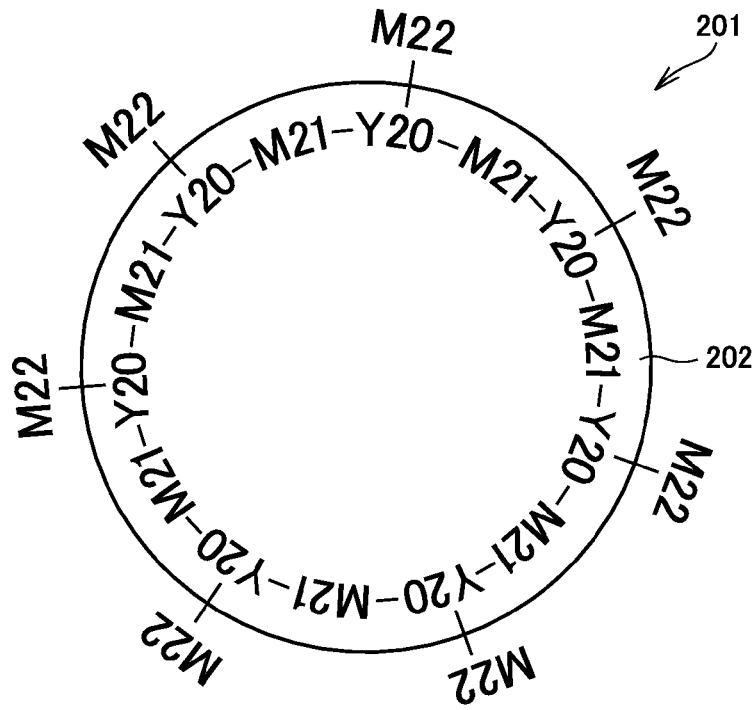
FIG. 8 is a schematic view showing a semiconductor nanoparticle phosphor in Embodiment 2-1 of the present invention.

As shown in FIG. 8, a semiconductor nanoparticle phosphor 201 contains a semiconductor nanoparticle 202 containing a first metal atom M21 and a first non-metal atom Y20, and a second metal atom M22 binding to at least a part of first non-metal atom Y20 existing on the surface of semiconductor nanoparticle 202.

Semiconductor nanoparticle 202 contains first metal atom M21 and first non-metal atom Y20.

Examples of first metal atom M21 include indium (In), cadmium (Cd), zinc (Zn), gallium (Ga) etc.

Examples of first non-metal atom Y20 include chalcogen atoms such as oxygen (O), sulfur (S), selenium (Se) and tellurium (Te), and pnictogen atoms such as nitrogen (N), phosphorus (P), arsenic (As), antimony (Sb) and bismuth (Bi).

As semiconductor nanoparticle 202, for example, a semiconductor nanoparticle core composed of one kind of a semiconductor crystal, such as InP, InN, InAs, InSb, InBi, CdSe, CdS, CdTe, ZnO, $In_2O_3$, $Ga_2O_3$, CdO, $ZrO_2$, $In_2S_3$, $Ga_2S_3$, $In_2Se_3$, $Ga_2Se_3$, $In_2Te_3$ or $Ga_2Te_3$, can be used. The semiconductor having such composition has a band gap energy at which visible light with a wavelength of 380 nm to 780 nm is emitted. Therefore, by controlling a particle size of the semiconductor nanoparticle and a mixed crystal ratio thereof, a semiconductor nanoparticle core capable of emitting any visible light can be formed.

InN or InP is preferably used as a semiconductor constituting the semiconductor nanoparticle core. The reason is that InN and InP are materials which are easily made due to a few materials for constitution and exhibit a high quantum yield, and InN and InP exhibit high light emission efficiency during irradiation of LED light. The quantum yield referred to herein is the ratio of the number of photons emitted as florescence to the number of absorbed photons.

As semiconductor nanoparticle 202, a semiconductor nanoparticle having a core/shell structure can be also used in which a shell layer is formed on the surface of the semiconductor nanoparticle core (hereinafter, in the present paragraph, in A/B, A indicates a core and B indicates a shell). As the semiconductor nanoparticle having a core/shell structure, for example, InP/GaP, InN/GaN and CdSe/CdS can be used. The shell layer has a thickness of preferably about 0.1 nm to 10 nm.

The particle size of the nanoparticle core of the semiconductor nanoparticle constituting the phosphor of the present invention is preferably in a range of 0.1 nm to 10 μm, particularly preferably in a range of 0.5 nm to 1 μm, and further preferably in a range of 1 to 20 nm. When the particle size of the nanoparticle core is less than 0.1 nm, there is a tendency of the band gap having an energy greater than that corresponding to visible luminescence and difficulty in control. On the other hand, when the particle size of the nanoparticle core exceeds 10 μm, light scattering at the surface of the phosphor becomes great, leading to a tendency of degradation in the property such as the light emitting efficiency. When the particle size of the nanoparticle core becomes less than or equal to two times the Bohr radius, the optical band gap will become larger due to the quantum size effect, in the phosphor of the present invention. The band gap is preferably in the range set forth above even in such a case. Adjustment may be conducted using both of the two control means set forth above.

At least a part of first non-metal atom Y20 existing on the surface of semiconductor nanoparticle 202 is chemically bound to second metal atom M22. This makes it possible to prevent elimination of first non-metal atom Y20 from the surface of the semiconductor nanoparticle, and to suppress generation of a defect on the surface of the semiconductor nanoparticle. Since exciton relaxation due to a defect on the semiconductor nanoparticle surface can be suppressed, the semiconductor nanoparticle phosphor can maintain high light emission efficiency.

As second metal atom M22, metal atoms forming a compound with first non-metal atom Y20 can be used. Examples of second metal atom M22 include group II elements such as zinc (Zn), cadmium (Cd) and mercury (Hg), group III elements such as aluminum (Al), gallium (Ga) and indium (In), group IV elements such as germanium (Ge), tin (Sn) and lead (Pb), etc.

Second metal atom M22 is preferably an element having a binding radius not greater than the binding radius of first metal atom M21 contained in the semiconductor nanoparticle. Consequently, second metal atom M22 becomes easy to bind to first non-metal atom Y20 existing on the semiconductor nanoparticle surface.

Second metal atom M22 may contain two or more kinds of metal atoms. In this case, the two or more kinds of metal atoms are preferably a combination of metal atoms having a great binding radius and a small binding radius. By combining atoms having different binding radiuses, the second metal atom having a small size is packed between a gap of second metal atoms having a great size, and therefore, the second metal atom becomes easy to bind to first non-metal atom Y20 existing on the semiconductor nanoparticle surface.

When second metal atom M22 is bound to first non-metal atom Y20 existing on the surface of semiconductor nanoparticle 202, a surface region containing two or more kinds of bonds is formed on the surface of semiconductor nanoparticle 202, which contains a bond M21-Y20 between first metal atom M21 and first non-metal atom Y20 and a bond M22-Y20 between second metal atom M22 and first non-metal atom Y20. The surface region means a region composed of an atom arranged on the outermost side among atoms constituting the semiconductor nanoparticle and an atom which binds to the aforementioned atom and is other than the constituent elements of the nanoparticle.

Analysis of the surface region containing two or more kinds of bonds can be conducted using X-ray photoelectron spectroscopy (XPS) measurement. The peak position in an XPS spectrum indicates the binding energy of a subject, and is shifted due to a difference in chemical state. Therefore, it is seen that when an XPS spectrum contains greater than or equal to two peaks, the surface region contains two or more kinds of bonds. It is possible to specify the kind of the bond from the peak position.

By formation of the surface region on the semiconductor nanoparticle surface, the following effect can be obtained.

Since the surface region containing two or more kinds of bonds is formed on the semiconductor nanoparticle surface, elimination of first non-metal atom Y20 from the surface of semiconductor nanoparticle 202 can be suppressed, exciton relaxation due to the surface defect can be decreased, and the light emission efficiency of the semiconductor nanoparticle phosphor can be improved.

Since the surface region containing two or more kinds of bonds is formed on the semiconductor nanoparticle surface, the surface region can firmly protect the semiconductor nanoparticle. By preventing the deterioration of the semiconductor nanoparticle due to an external factor, the semiconductor nanoparticle phosphor can have excellent chemical stability.

By forming the surface region containing two or more kinds of bonds on the semiconductor nanoparticle surface, a material having high quantum confinement effect can be selected as the surface region, and therefore, the semiconductor nanoparticle phosphor can maintain high light emission efficiency.

In the surface region formed on the semiconductor nanoparticle surface and containing two or more kinds of bonds, a distance in the particle size direction of the nanoparticle corresponds to one bond, and therefore, the light emission efficiency of the semiconductor nanoparticle phosphor due to lattice mismatch at the interface between the semiconductor nanoparticles and a strain generated in the surface region does not occur, and the semiconductor nanoparticle phosphor can maintain high light emission efficiency.

In the surface region formed on the semiconductor nanoparticle surface and containing two or more kinds of bonds, a distance in the particle size direction of the nanoparticle corresponds to one bond, and therefore, a change in the particle size of the semiconductor nanoparticle is not caused before and after the formation of the surface region, and the light emission wavelength of the semiconductor nanoparticle does not change. Therefore, a desired light emission wavelength can be conveniently obtained.

As a material of the surface region, a substance having extremely low reactivity with oxygen, moisture or the like is preferably used. Furthermore, a substance having a band gap greater than the band gap of the semiconductor nanoparticle is preferably used. When such a substance is used as a material of the surface region, the quantum efficiency of the semiconductor nanoparticle phosphor is improved due to the quantum confinement effect.

For example, $InGaO_3$, $InAlO_3$, $AlGaO_3$, $Cd_{(1-x)}Zn_xO$, $Ti_{(1-x)}Zr_xO_2$, $InGaS_3$, $InAlS_3$, $AlGaS_3$, $Cd_{(1-x)}Zn_xS$, $InGaSe_3$, $InAlSe_3$, $AlGaSe_3$, $Cd_{(1-x)}Zn_xSe$, $InGaTe_3$, $InAlTe_3$, $AlGaTe_3$, $Cd_{(1-x)}Zn_xTe$, $In_{(1-x)}Ga_xN$, $In_{(1-x)}Ga_xP$, $In_{(1-x)}Ga_xAs$, $In_{(1-x)}Ga_xSb$, $In_{(1-x)}Ga_xBi$, etc., are preferably used as a material of the surface region containing two or more kinds of bonds. These materials are compounds, and may be crystalline or amorphous.

Examples of a combination of the material of the semiconductor nanoparticle phosphor and the material of the surface region containing two or more kinds of bonds (hereinafter, in C/D in the present paragraph, C indicates a semiconductor nanoparticle phosphor and D indicates the surface region) include $In_2O_3/InGaO_3$, $In_2O_3/InAlO_3$, $Ga_2O_3/AlGaO_3$, $CdO/Cd_{(1-x)}Zn_xO$, $ZrO_2/Ti_{(1-x)}Zr_xO_2$, $In_2S_3/InGaS_3$, $In_2S_3/InAlS_3$, $Ga_2S_3/AlGaS_3$, $CdS/Cd_{(1-x)}Zn_xS$, $In_2Se_3/InAlSe_3$, $Ga_2Se_3/AlGaSe_3$, $CdSe/Cd_{(1-x)}Zn_xSe$, $In_2Te_3/InGaTe_3$, $In_2Te_3/InAlTe_3$, $Ga_2Te_3/AlGaTe_3$, $CdTe/Cd_{(1-x)}Zn_xTe$, $InN/In_{(1-x)}Ga_xN$, $InP/In_{(1-x)}Ga_xP$, $InAs/In_{(1-x)}Ga_xAs$, $InSb/In_{(1-x)}Ga_xSb$ and $InBi/In_{(1-x)}Ga_xBi$.

<Method for Manufacturing Semiconductor Nanoparticle Phosphor>

A method for manufacturing semiconductor nanoparticle phosphor 201 of Embodiment 2-1 includes the steps of: obtaining the semiconductor nanoparticle; and forming the surface region containing two or more kinds of bonds on the semiconductor nanoparticle surface.

The step of obtaining the semiconductor nanoparticle is not particularly limited, and a known method for manufacturing a semiconductor nanoparticle can be used. From the viewpoint that a procedure is convenient and is conducted at low costs, a chemical synthesis method is preferably used as the method for manufacturing the semiconductor nanoparticle. In the chemical synthesis method, an objective product can be obtained by dispersing a plurality of starting substances containing constituent elements of the product substance in a medium, and then causing reaction of the starting substances. Examples of the chemical synthesis method include a sol gel method (colloid method), a hot soap method, a reverse micelle method, a solvothermal method, a molecular precursor method, a hydrothermal synthesis method, a flux method etc. From the viewpoint of suitably manufacturing the semiconductor nanoparticle composed of the compound semiconductor material, a hot soap method is preferably used. One example of the method for manufacturing the semiconductor nanoparticle by hot soap method is shown below.

First, the semiconductor nanoparticle core is subjected to liquid phase synthesis. For example, when a semiconductor nanoparticle core composed of InN is manufactured, a flask or the like is filled with 1-octadecene (solvent for synthesis), and indium myristate, sodium amide and hexadecanethiol (HDT) are mixed with one another. After this mixed liquid is sufficiently stirred, the materials are caused to react at 180 to 280° C. This provides the semiconductor nanoparticle core composed of InN, and HDT is bound to the external surface of the resulting semiconductor nanoparticle core. HDT may be added after growth of the shell layer.

A solvent for synthesis used in the hot soap method is preferably a compound solution composed of carbon atoms and hydrogen atoms (hereinafter, referred to as "hydrocarbon-based solvent". This prevents mixing of water or oxygen into the solvent for synthesis, and therefore, oxidation of the semiconductor nanoparticle core is prevented. The hydrocarbon-based solvent is preferably, for example, n-pentane, n-hexane, n-heptane, n-octane, cyclopentane, cyclohexane, cycloheptane, benzene, toluene, o-xylene, m-xylene, or p-xylene.

In the hot soap method, in principle, as a reaction time is longer, the particle size of the semiconductor nanoparticle core becomes greater. Accordingly, by conducting liquid phase synthesis while the particle size is monitored with photoluminescence or light absorption, the size of the semiconductor nanoparticle core can be controlled at a desired size.

Then, a reaction reagent serving as a raw material of the shell layer is added to a solution containing the semiconductor nanoparticle core, and the materials are caused to react under heating. This provides the semiconductor nanoparticle. In the resulting semiconductor nanoparticle, the outer surface of the semiconductor nanoparticle core is covered with the shell layer.

Subsequently, the surface region containing two or more kinds of bonds is formed on the semiconductor nanoparticle surface. For example, in the state where a second metal atom raw material constituting the surface region containing two or more kinds of bonds can be supplied to the semiconductor nanoparticle surface, the surface region having one bond in the particle size direction of the nanoparticle and containing two or more kinds of bonds can be formed by extracting, with a reducing agent, an oxidizing agent, photooxidation reaction or the like, a part or all of surface modifying groups covering the semiconductor nanoparticle surface to cause the second metal atom raw material to react with the semiconductor nanoparticle surface.

In the state where the semiconductor nanoparticle surface is protected with the surface modifying agent containing the second metal atom, an alkyl chain of the surface modifying agent is removed by an oxidation reaction, a photoreaction or the like, and the surface region having one bond in the particle size direction of the nanoparticle and containing two or more kinds of bonds can be formed.

Previously, since a layer composed of the same kind of metal atom as first metal atom M21 constituting the semiconductor nanoparticle was formed as a layer containing an electron donating group on the semiconductor nanoparticle, there was a problem that it is difficult to select a covering material having high quantum confinement effect for core. In the present embodiment, by supplying one or more kinds of second metal atoms M22, which are different from first metal atoms M21, to non-metal atom Y20 constituting the outermost surface layer of the semiconductor nanoparticle, the surface region containing two or more kinds of bonds is formed. Therefore, the semiconductor nanoparticle can be covered with a substance having high quantum confinement effect.

[Embodiment 2-2]

A semiconductor nanoparticle phosphor in Embodiment 2-2 will be described with reference to FIG. 9.

Figure 9:
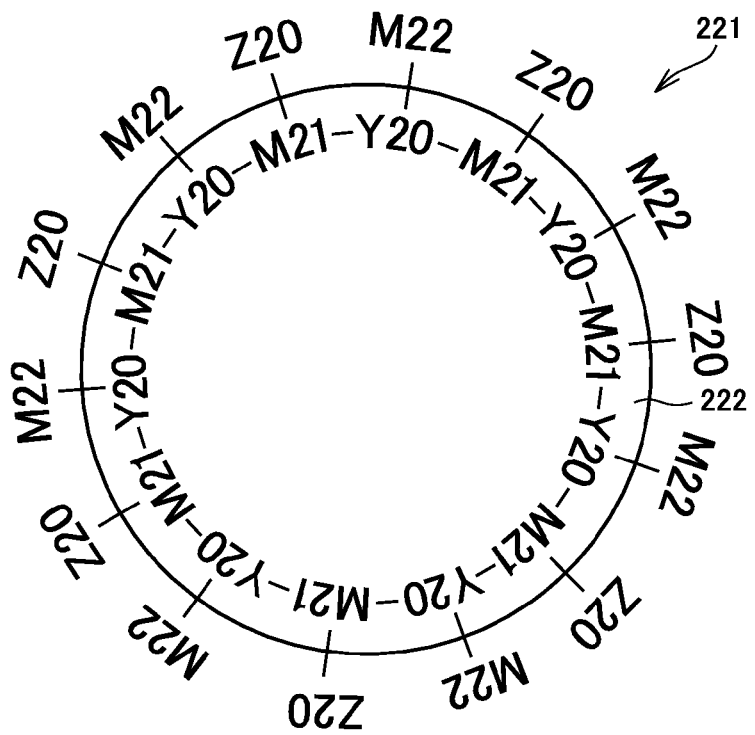
FIG. 9 is a schematic view showing a semiconductor nanoparticle phosphor in Embodiment 2-2 of the present invention.

As shown in FIG. 9, a semiconductor nanoparticle phosphor 221 contains a semiconductor nanoparticle 222 containing first metal atom M21 and first non-metal atom Y20, second metal atom M22 binding to at least a part of first non-metal atom Y20 existing on the surface of semiconductor nanoparticle 222, and a second non-metal atom Z20 binding to at least a part of first metal atom M21 existing on the surface of semiconductor nanoparticle 222.

Semiconductor nanoparticle phosphor 221 of Embodiment 2-2 has a constitution similar to that of semiconductor nanoparticle phosphor 201 of Embodiment 2-1 except that nanoparticle phosphor 221 contains second non-metal atom Z20 binding to at least a part of first metal atom M21 existing on the surface of semiconductor nanoparticle 222.

In semiconductor nanoparticle phosphor 221 of Embodiment 2-2, at least a part of first metal atom M21 existing on the surface of semiconductor nanoparticle 222 is coordinately bound to second non-metal atom Z20. When first metal atom M21 is not bound to other atoms, the dangling bond of first metal atom M21 makes a new energy level in a forbidden band of the energy level in the interior of the semiconductor nanoparticle, and there is a possibility that the fluorescent efficiency in the band end of the semiconductor nanoparticle phosphor is degraded. In semiconductor nanoparticle phosphor 221, since first metal atom M21 is bound to second non-metal atom Z20, the dangling bond is terminated, and the fluorescent efficiency in the band end of semiconductor nanoparticle phosphor 221 is improved.

As second non-metal atom Z20, a non-metal atom forming a compound with first metal atom M21 can be used. Examples thereof include halogen atoms such as fluorine (F), chlorine (Cl), bromine (Br) and iodine (I), chalcogen atoms such as oxygen (O), sulfur (S), selenium (Se) and tellurium (Te), and pnictogen atoms such as nitrogen (N), phosphorus (P), arsenic (As), antimony (Sb) and bismuth (Bi).

A surface region containing two or more kinds of bonds is formed on the surface of semiconductor nanoparticle 221 of Embodiment 2-2, which contains first metal atom M21, second metal atom M22, first non-metal atom Y20 and second non-metal atom 20 and has one bond in the particle size direction of the nanoparticle.

For example, $InGaO_3$, $In_{(1-x)}Ga_xN$, $Cd_{(1-x)}Zn_xS$, $InAlS_3$ and $AlGaS_3$ are preferably used as a material of the surface region containing two or more kinds of bonds.

Examples of a combination of the material of the semiconductor nanoparticle phosphor and the material of the surface region containing two or more kinds of bonds (hereinafter, in C/D in the present paragraph, C indicates a semiconductor nanoparticle phosphor and D indicates the surface region containing two or more kinds of bonds) include $InN/InGaO_3$, $InP/In_{(1-x)}Ga_xN$, $CdSe/Cd_{(1-x)}Zn_xS$, $In_2Se_3/InAlS_3$ and $Ga_2Se_3/AlGaS_3$.

<Method for Manufacturing Semiconductor Nanoparticle Phosphor>

The semiconductor nanoparticle phosphor of Embodiment 2-2 can be manufactured, for example, by the following method.

First, the semiconductor nanoparticle phosphor of Embodiment 2-1 is obtained by the method similar to that of Embodiment 2-1.

Subsequently, in the state where a second non-metal atom raw material constituting the surface region containing two or more kinds of bonds can be supplied to the semiconductor nanoparticle surface, second non-metal atom Z20 is coordinately bound to first metal atom M21 on the semiconductor nanoparticle surface by extracting, with heating, light irradiation or the like, a part or all of surface modifying groups covering the semiconductor nanoparticle surface to cause the second non-metal atom raw material to react with the semiconductor nanoparticle surface. This provides the surface region containing two or more kinds of bonds on the surface of the semiconductor nanoparticle, which contains first metal atom M21, second metal atom M22, first non-metal atom Y20 and second non-metal atom 20 and has one bond in the particle size direction of the nanoparticle.

[Embodiment 2-3]

A semiconductor nanoparticle phosphor in Embodiment 2-3 will be described with reference to FIG. 10.

Figure 10:
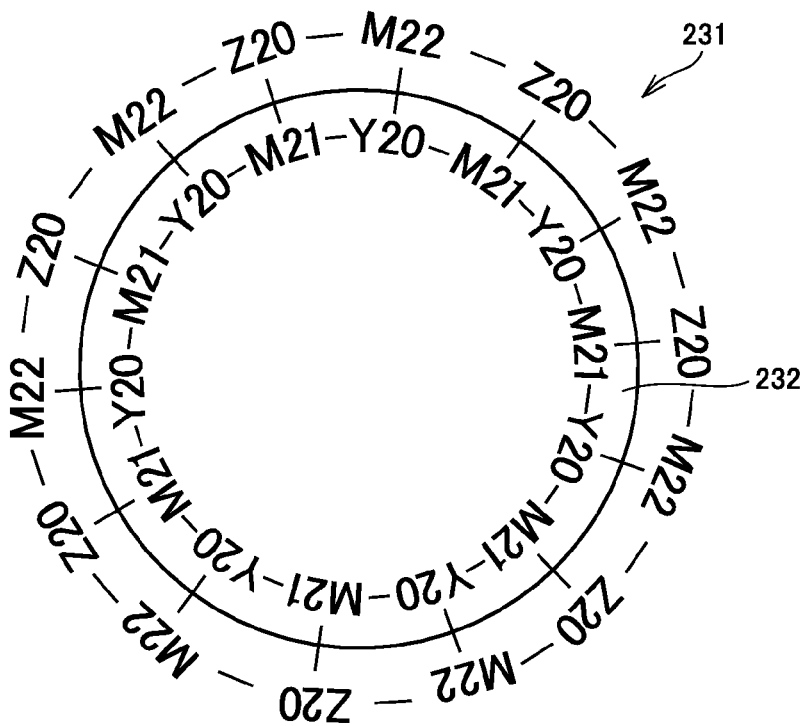
FIG. 10 is a schematic view showing a semiconductor nanoparticle phosphor in Embodiment 2-3 of the present invention.

As shown in FIG. 10, a semiconductor nanoparticle phosphor 231 contains a semiconductor nanoparticle 232 containing first metal atom M21 and first non-metal atom Y20, second metal atom M22 binding to at least a part of first non-metal atom Y20 existing on the surface of semiconductor nanoparticle 232, and second non-metal atom Z20 binding to at least a part of first metal atom M21 existing on the surface of semiconductor nanoparticle 232, and second metal atom M22 is bound to second non-metal atom Z20.

Semiconductor nanoparticle phosphor 231 of Embodiment 2-3 has a construction similar to that of semiconductor nanoparticle phosphor 221 of Embodiment 2 except that second metal atom M22 is bound to second non-metal atom Z20.

A surface region containing two or more kinds of bonds is formed on the surface of semiconductor nanoparticle 231 of Embodiment 2-3, which contains first metal atom M21, second metal atom M22, first non-metal atom Y20 and second non-metal atom 20 and has one bond in the particle size direction of the nanoparticle. When second metal atom M22 is coordinately bound to second non-metal atom Z20, the binding force of the whole surface region containing two or more kinds of bonds becomes firm, and the durability of the semiconductor nanoparticle phosphor to an external factor is improved.

<Method for Manufacturing Semiconductor Nanoparticle Phosphor>

The semiconductor nanoparticle phosphor of Embodiment 2-3 can be manufactured, for example, by the following method.

First, the semiconductor nanoparticle phosphor of Embodiment 2-1 is obtained by the method similar to that of Embodiment 2-1.

Subsequently, in the state where a second non-metal atom raw material constituting the surface region containing two or more kinds of bonds can be supplied to the semiconductor nanoparticle surface, second non-metal atom Z20 is coordinately bound to first metal atom M21 on the semiconductor nanoparticle surface by extracting, with heating, light irradiation or the like, a part or all of surface modifying groups covering the semiconductor nanoparticle surface to cause the second non-metal atom raw material to react with the semiconductor nanoparticle surface. At this time, by appropriately combining second metal atom M22 and second non-metal atom Z20, second metal atom M22 is coordinately bound to second non-metal atom Z20. Specific examples of the combination of M22 and Z20 (in M22-Z20 in the present paragraph, M22 indicates a second metal atom, and Z20 indicates a second non-metal atom) include In—S, In—Se, In—O, Ga—S, Ga—Se, Ga—O, Al—S, Al—O, Cd—S, Cd—O etc.

[Embodiment 2-4]

A semiconductor nanoparticle phosphor in Embodiment 2-4 will be described with reference to FIG. 11.

Figure 11:
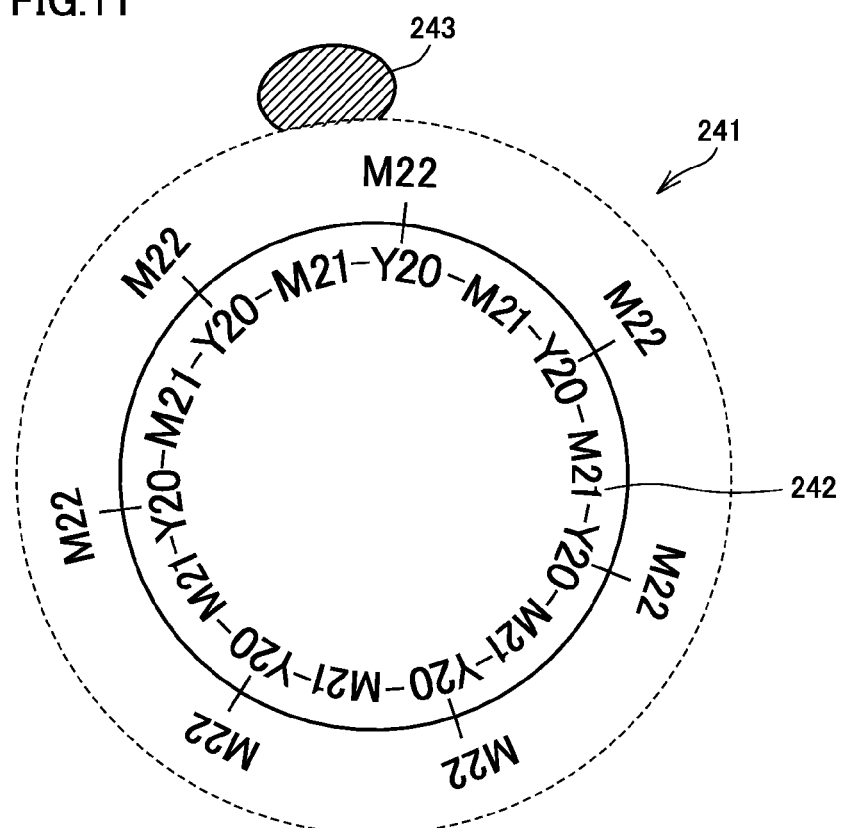
FIG. 11 is a schematic view showing a semiconductor nanoparticle phosphor in Embodiment 2-4 of the present invention.

As shown in FIG. 11, a semiconductor nanoparticle phosphor 241 contains a semiconductor nanoparticle 242 containing first metal atom M21 and first non-metal atom Y20, and second metal atom M22 binding to at least a part of first non-metal atom Y20 existing on the surface of semiconductor nanoparticle 242. A single multicomponent layer containing first metal atom M21, second metal atom M22 and first non-metal atom Y20 is formed on the surface of semiconductor nanoparticle phosphor 241, and an inorganic crystal 243 is formed on at least a part of the surface of the multicomponent layer.

FIG. 11 shows an embodiment containing first metal atom M21, second metal atom M22 and first non-metal atom Y20 as a surface region containing two or more kinds of bonds, but the surface region containing two or more kinds of bonds may further contain second non-metal atom Z20 as in Embodiment 2. In the surface region containing two or more kinds of bonds, second metal atom 22 may be bound to second non-metal atom Z20 as in Embodiment 2-3.

As the inorganic crystal, an inorganic crystal absorbing ultraviolet rays can be used. This makes it possible to prevent the semiconductor nanoparticle from deterioration due to ultraviolet rays, and the chemical stability of the semiconductor nanoparticle phosphor is improved. As the inorganic crystal, for example, a wide gap semiconductor nanoparticle such as ZnS, ZnO, $TiO_2$, $ZrO_2$, $Al_2O_3$, ZnO:Mg, ZnO:Be, or GaN, or an inorganic phosphor nanoparticle such as $YVO_4$ can be used.

<Method for Manufacturing Semiconductor Nanoparticle Phosphor>

The semiconductor nanoparticle phosphor of Embodiment 2-4 can be manufactured, for example, by the following method.

First, any of the semiconductor nanoparticle phosphors of Embodiments 2-1 to 2-3 is obtained by the method similar to that of any of Embodiments 2-1 to 2-3.

Subsequently, an inorganic crystal can be formed on the surface of the semiconductor nanoparticle by subjecting the resulting semiconductor nanoparticle to sol gel method, liquid phase reducing method, hydrothermal synthesis method or the like.

[Embodiment 2-5]

A light emitting element in Embodiment 2-5 will be described with reference to FIG. 12.

Figure 12:
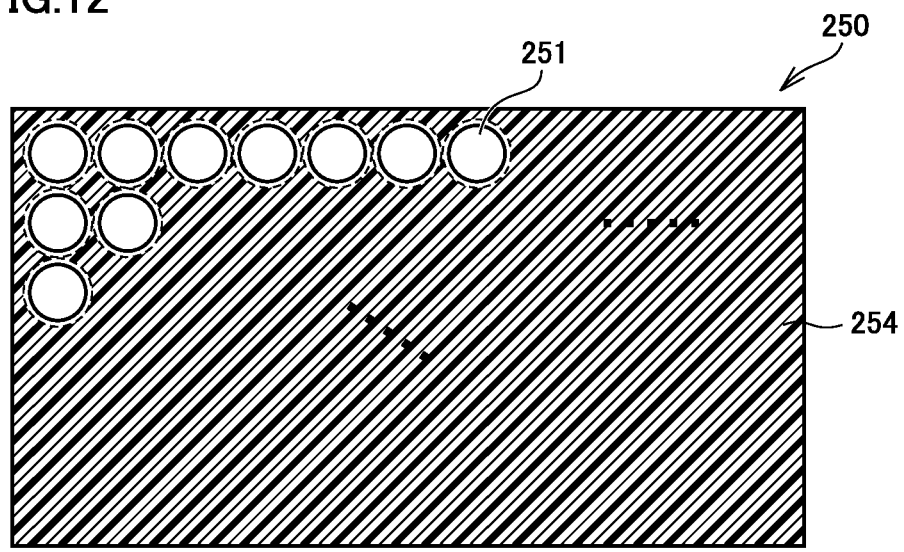
FIG. 12 is a schematic view showing a light emitting element in Embodiment 2-5 of the present invention.
Figure 13:
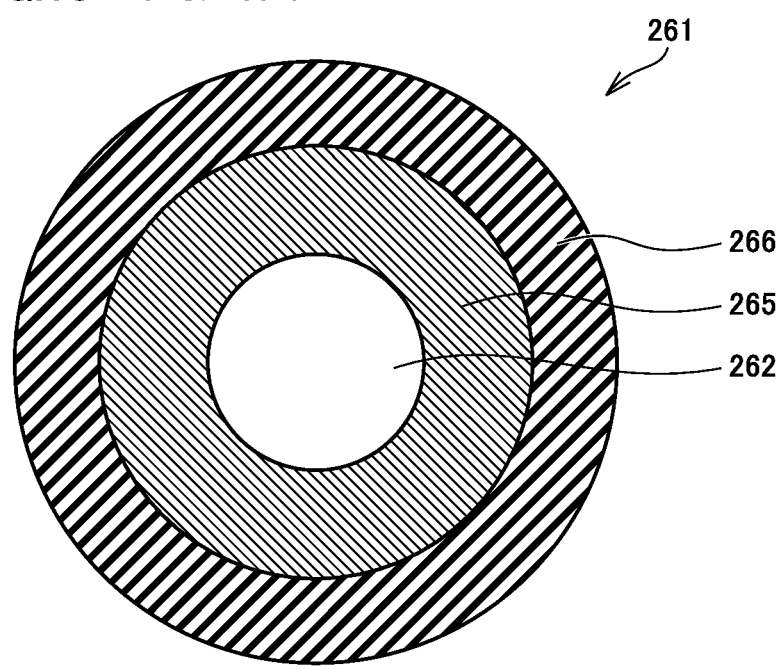
FIG. 13 is a schematic view showing a semiconductor nanoparticle phosphor of a conventional example.

As shown in FIG. 12, a light emitting element 250 contains semiconductor nanoparticle phosphors 251 of any of Embodiments 2-1 to 2-4 and a transparent member 254. Semiconductor nanoparticle phosphors 251 are dispersed in transparent member 254. In the semiconductor nanoparticle phosphors of Embodiments 2-1 to 2-4, since the surface region containing two or more kinds of bonds is arranged outside the semiconductor nanoparticle, the semiconductor nanoparticles are not contacted to each other. For this reason, in the semiconductor nanoparticle phosphors of Embodiments 2-1 to 2-4, an interface defect is not formed between the semiconductor nanoparticle phosphors, and the semiconductor nanoparticle phosphors can be most closely packed in a transparent member matrix. In the semiconductor nanoparticle phosphors of Embodiments 2-1 to 2-4, a distance in the particle size direction of the nanoparticle in the surface region containing two or more kinds of bonds arranged outside of the semiconductor nanoparticle is one bond, and therefore, when the semiconductor nanoparticle phosphors are dispersed in the transparent member, a distance between the semiconductor nanoparticle phosphors becomes short. Therefore, the semiconductor nanoparticle phosphors of Embodiments 2-1 to 2-4 can be contained in a device at a higher concentration, as compared with the semiconductor nanoparticle phosphors which are dispersed in the transparent member by possession of surface modifying group on their surfaces.

A glass material or a polymer material is preferably used as transparent member 254. The volumetric ratio of the semiconductor nanoparticle phosphor to the transparent member may be a value depending on utility of the light emitting element, and the ratio is preferably greater than or equal to 0.000001 and less than or equal to 10. When the volumetric ratio is greater than or equal to 0.000001 and less than or equal to 10, the semiconductor nanoparticle phosphors more hardly aggregate, and are easily dispersed in the transparent member more uniformly. When the transparency of the light emitting element is regarded as important, the volumetric ratio of the semiconductor nanoparticle phosphor to the transparent member is preferably less than or equal to 0.2, and further preferably less than or equal to 0.1. When the volumetric ratio is less than or equal to 0.2, the light emitting element having high transparency can be obtained, and when the volumetric ratio is less than or equal to 0.1, the light emitting element having further high transparency can be obtained. When the light emission amount of the light emitting element is regarded as important, the volumetric ratio of the semiconductor nanoparticle phosphor to the transparent member is preferably greater than or equal to 0.00001. When the volumetric ratio is greater than or equal to 0.00001, the light emitting element having great light emission amount can be obtained.

A glass material or a polymer material is preferably used as the transparent member. The transparent member contains the glass material or the polymer material preferably at greater than or equal to 80% by volume, and further preferably at greater than or equal to 90% by volume. When the transparent member contains the glass material or the polymer material at greater than or equal to 80% by volume, the light emitting element having high transparency or high efficiency can be obtained, and when the transparent member contains the glass material or the polymer material at greater than or equal to 90% by volume, the light emitting element having further high transparency or further high efficiency can be obtained.

<Method for Manufacturing Light Emitting Element>

When semiconductor nanoparticle phosphors 251 are sealed in transparent member 254, a process for curing the transparent member is conducted after semiconductor nanoparticle phosphors 251 are dispersed in transparent member 254.

As the glass material, tetramethoxysilane (TMOS), tetraethoxysilane (TEOS), tetrapropoxysilane, tetrabutoxysilane, etc. can be used, and the glass material is cured by progression of condensation reaction. In order to accelerate the progression rate of the condensation reaction, heating may be conducted or an acid or a base may be added to the system. The method for dispersing the semiconductor nanoparticle phosphor in the glass material can be conducted by stirring a solution in which the glass material is mixed with the semiconductor nanoparticle phosphor, etc.

As the polymer material, for example, an acrylic resin such as polymethyl methacrylate (PMMA), an epoxy resin composed of bisphenol A and epichlorohydrin or the like, etc. can be used, and the polymer material is cured to be a resin (conversion into solid) by progression of the condensation reaction. As the curing method, a photocuring method for curing the material by irradiation of ultraviolet rays, or a thermal curing method for curing the material by heating can be used.

[Embodiment 3-1]

<Semiconductor Nanoparticle Phosphor>

A semiconductor nanoparticle phosphor in one embodiment of the present invention will be described with reference to FIGS. 14 and 15.

Figure 14:
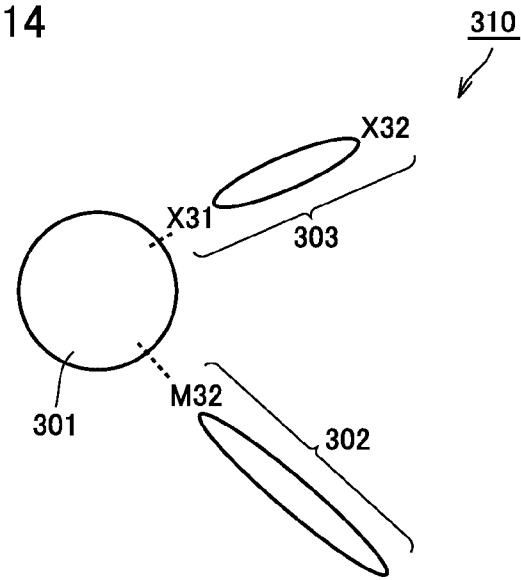
FIG. 14 is a schematic view of a semiconductor nanoparticle phosphor in one embodiment of the present invention.
Figure 15:
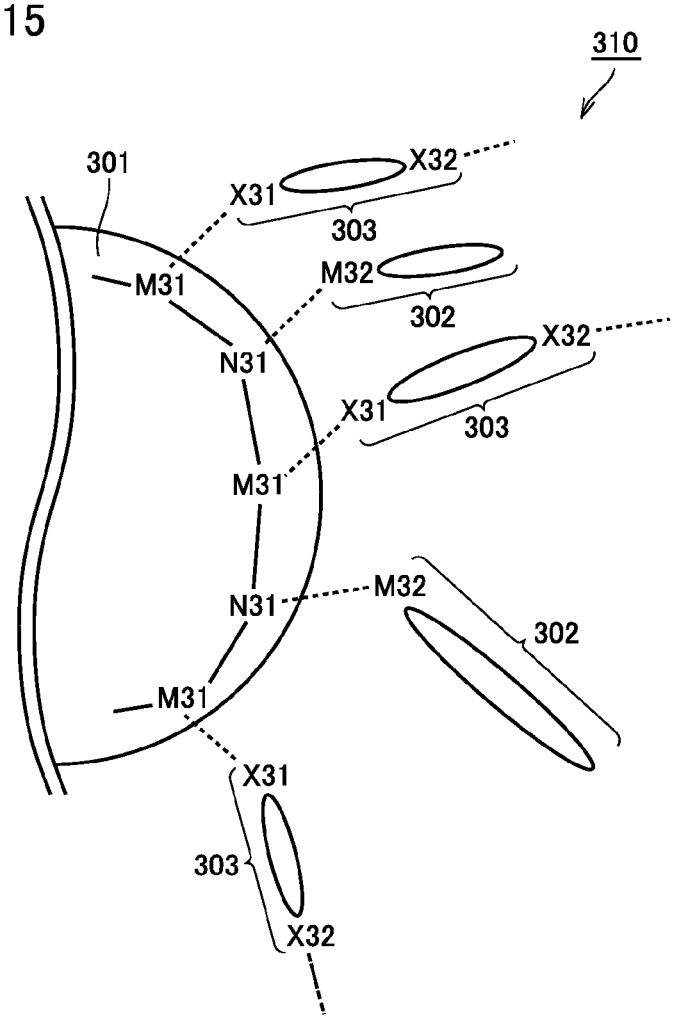
FIG. 15 is a schematic view of the surface of a semiconductor nanoparticle phosphor in one embodiment of the present invention.

As shown in FIGS. 14 and 15, a semiconductor nanoparticle phosphor 310 contains a semiconductor nanoparticle 301 containing a first non-metal atom N31 and a first metal atom M31, a metal fatty acid salt 302 binding to first non-metal atom N31, and an organic compound 303 which binds to first metal atom M 31 and contains a functional group having hetero atoms on both ends (hereinafter, also referred to as hetero atom-containing organic compound).

Semiconductor nanoparticle 301 contains first non-metal atom N31 and first metal atom M31. First non-metal atom N31 and first metal atom M31 exist on the surface of semiconductor nanoparticle 301, and can bind to a compound existing outside semiconductor nanoparticle 301.

Examples of first non-metal atom N31 include halogen atoms such as fluorine (F), chlorine (Cl), bromine (Br) and iodine (I), chalcogen atoms such as oxygen (O), sulfur (S), selenium (Se) and tellurium (Te), and pnictogen atoms such as nitrogen (N), phosphorus (P), arsenic (As), antimony (Sb) and bismuth (Bi).

Examples of first metal atom M31 include indium (In), gallium (Ga), zinc (Zn), cadmium (Cd) etc.

As semiconductor nanoparticle 301, for example, a semiconductor nanoparticle composed of one kind semiconductor crystal, such as InP, InN, InAs, InSb, InBi, ZnO, $In_2O_3$, $Ga_2O_3$, $ZrO_2$, $In_2S_3$, $Ga_2S_3$, $In_2Se_3$, $Ga_2Se_3$, $In_2Te_3$, $Ga_2Te_3$, CdSe, CdTe or CdS, can be used. A semiconductor having such composition has a band gap energy at which visible light with a wavelength of 380 nm to 780 nm is emitted. Therefore, by controlling a particle size of the semiconductor nanoparticle and a mixed crystal ratio thereof, a semiconductor nanoparticle capable of emitting any visible light can be formed.

InN or InP is preferably used as a semiconductor constituting semiconductor nanoparticle 301. The reason is that InN and InP are materials which are easily made due to a few materials for constitution and exhibit a high quantum yield, and InN and InP exhibit high light emission efficiency during irradiation of LED light. The quantum yield referred to herein is the ratio of the number of photons emitted as florescence to the number of absorbed photons.

Semiconductor nanoparticle 301 has a particle size of preferably in a range of 0.1 nm to 100 nm, more preferably in a range of 0.5 nm to 50 nm, and further preferably in a range of 1 to 20 nm.

When the particle size is less than or equal to two times of the exciton Bohr radius, light emission intensity is extremely improved. The Bohr radius indicates spreading of the existence probability of an exciton, and is represented by a mathematic equation (1) below. For example, the exciton Bohr radius of GaN is around 3 nm, and the exciton Bohr radius of InN is around 7 nm.

$$y = 4\pi\epsilon h^2 \cdot me^2 \qquad \text{Equation (1)}$$

In equation (1), y represents the Bohr radius, $\epsilon$ represents permittivity, h represents the Plank's constant, m represents an effective mass, and e represents an elementary electrical charge.

A surface defect derived from the dangling bond (uncombined bond) of first non-metal atom N31 and first metal atom M31 exists on the surface of semiconductor nanoparticle 301. Due to the surface defect, the light emission efficiency of the semiconductor nanoparticle is degraded.

In semiconductor nanoparticle phosphor 310 of the present embodiment, at least a part of first non-metal atom N31 existing on the surface of semiconductor nanoparticle 301 is bound to metal fatty acid salt 302 containing second metal atom M32. Specifically, first non-metal atom N31 existing on the surface of the semiconductor nanoparticle is firmly bound to second metal atom M32 existing at an end of metal fatty acid salt 32. Accordingly, the dangling bond of first non-metal atom N31 is capped, and the surface defect of semiconductor nanoparticle 301 is suppressed. Therefore, degradation in light emission efficiency of semiconductor nanoparticle 301 can be suppressed.

As metal fatty acid salt 302, for example, gallium stearate, indium stearate, zinc stearate, gallium palmitate, indium palmitate, zinc palmitate, gallium myristate, indium myristate, zinc myristate, gallium laurate, indium laurate, zinc laurate, gallium undecylate, indium undecylate, zinc undecylate, gallium stearylsulfate, indium stearylsulfate, gallium palmitylsulfate, indium palmitylsulfate, zinc palmitylsulfate, zinc stearylsulfate, gallium myristylsulfate, indium myristylsulfate, zinc myristylsulfate, gallium laurylsulfate, indium laurylsulfate, zinc laurylsulfate, gallium stearylphosphate, indium stearylphosphate, zinc stearylphosphate, gallium palmitylphosphate, indium palmitylphosphate, zinc palmitylphosphate, gallium myristylphosphate, indium myristylphosphate, zinc myristylphosphate, gallium laurylphosphate, indium laurylphosphate, or zinc laurylphosphate can be used.

Second metal atom M32 contained in metal fatty acid salt 302 is preferably the same element as first metal atom M31 existing on the surface of semiconductor nanoparticle 301. For example, when an InP nanoparticle is used as semiconductor nanoparticle 301, second metal atom M32 contained in metal fatty acid salt 302 is preferably indium (In). The reason for this will be described below.

A bond between first metal atom M31 and first non-metal atom N31 (hereinafter, also referred to as M31-N31 bond) exists in a crystal of semiconductor nanoparticle 301. A bond between second non-metal atom N31 and second metal atom M32 contained in the metal fatty acid salt (hereinafter, also referred to as N31-M32 bond) exists on the surface of semiconductor nanoparticle 301. When first metal atom M31 and second metal atom M32 are the same elements, since second non-metal atom N31 existing on the surface of semiconductor nanoparticle 301 is effectively bound to second metal atom M32 contained in the metal fatty acid salt, the surface of semiconductor nanoparticle 301 can be effectively protected. The M31-N31 bond existing in the crystal of semiconductor nanoparticle 301 is not discriminated from the N31-M32 bond existing on the surface of semiconductor nanoparticle 301, and the dangling bond, defect or the like can be suppressed.

In semiconductor nanoparticle phosphor 310 of the present embodiment, at least a part of first metal atom M31 existing on the surface of semiconductor nanoparticle 301 contains a functional group X31 having a hetero atom at one end, and is bound to hetero atom-containing organic compound 303 containing a second functional group X32 having a hetero atom at the other end. Here, the hetero atom means all atoms except for a hydrogen atom and a carbon atom. In hetero atom-containing organic compound 303, the functional group existing at an end contains a hetero atom, a non-covalent electron pair or electric bias is generated. For this reason, first metal atom M31 existing on the surface of the semiconductor nanoparticle is firmly bound to first functional group X31 existing at one end of hetero atom-containing organic compound 303. Accordingly, the dangling bond of first metal atom M31 is capped, and the surface defect of semiconductor nanoparticle 301 is suppressed. Therefore, degradation in light emission efficiency of semiconductor nanoparticle 301 can be suppressed. In FIGS. 14 and 15, first functional group X31 is bound to first metal atom M31, but second functional group X32 may be bound to first metal atom M31.

As organic compound 303 containing a functional group having hetero atoms on both ends, for example, a dithiol compound, a diamine compound, a thiocarboxylic acid and an aminothiol compound can be used. More specifically, 1,6-hexanediamine, 1,5-diaminopentane, 1,7-diaminoheptane, 1,6-hexanedithiol, 1,8-octanedithiol, 1,4-benzenedithiol, 1,2-ethanedithiol, 1,3-propanedithiol, cysteamine and the like can be used.

In semiconductor nanoparticle 301, the surface defect is protected with metal fatty acid salt 302 and hetero atom-containing organic compound 303, and the surface defect is suppressed. Therefore, semiconductor nanoparticle phosphor 310 can suppress inactivation of excitation energy, and has excellent light emission efficiency.

In the semiconductor nanoparticle, metal fatty acid salt 302 and hetero atom-containing organic compound 303 are bound to the surface. This makes it possible to easily isolate semiconductor nanoparticle phosphors 310, and accordingly, the dispersibility of semiconductor nanoparticle phosphor 310 becomes high. Therefore, aggregation of semiconductor nanoparticle phosphors 310 can be prevented.

The structure of the semiconductor nanoparticle phosphor can be observed by structural observation such as TEM (Transmission Electron Microscopy), TEM-EDX (Energy Dispersive X-ray Spectroscopy) or the like, or structural and compositional analysis such as XPS (X-ray Photoelectron Spectroscopy), IR (Infrared Spectroscopy) or the like.

<Method for Manufacturing Semiconductor Nanoparticle Phosphor>

One example of a method for manufacturing the semiconductor nanoparticle phosphor of Embodiment 3-1 will be described. The method for manufacturing the semiconductor nanoparticle phosphor includes the steps of: obtaining the semiconductor nanoparticle containing first non-metal atom N31 and first metal atom M31; binding the metal fatty acid salt to first non-metal atom N31 existing on the surface of the semiconductor nanoparticle; and binding the organic compound containing a functional group having hetero atoms on both ends to first metal atom M31 existing on the surface of the semiconductor nanoparticle.

The step of obtaining the semiconductor nanoparticle is not particularly limited, and a known method for manufacturing a semiconductor nanoparticle can be used. From the viewpoint that a procedure is convenient and is conducted at low costs, a chemical synthesis method is preferably used. In the chemical synthesis method, an objective product can be obtained by dispersing a plurality of starting substances containing constituent elements of the product substance in a medium, and then causing reaction of the starting substances. Examples of the chemical synthesis method include a sol gel method (colloid method), a hot soap method, a reverse micelle method, a solvothermal method, a molecular precursor method, a hydrothermal synthesis method, a flux method etc. From the viewpoint of suitably manufacturing the semiconductor nanoparticle composed of the compound semiconductor material, a hot soap method is preferably used. One example of the method for manufacturing the semiconductor nanoparticle by hot soap method is shown below.

First, the semiconductor nanoparticle is subjected to liquid phase synthesis. For example, when a semiconductor nanoparticle composed of InN is manufactured, a flask or the like is filled with 1-octadecene (solvent for synthesis), and indium myristate and sodium amide are mixed with each other. After this mixed liquid is sufficiently stirred, the materials are caused to react at 180 to 280° C. This provides the semiconductor nanoparticle composed of InN.

A solvent for synthesis used in the hot soap method is preferably a compound solution composed of carbon atoms and hydrogen atoms (hereinafter, referred to as "hydrocarbon-based solvent". This prevents mixing of water or oxygen into the solvent for synthesis, and therefore, oxidation of the semiconductor nanoparticle is prevented. The hydrocarbon-based solvent is preferably, for example, n-pentane, n-hexane, n-heptane, n-octane, cyclopentane, cyclohexane, cycloheptane, benzene, toluene, o-xylene, m-xylene, or p-xylene.

In the hot soap method, in principle, as a reaction time is longer, the particle size of the semiconductor nanoparticle becomes greater. Accordingly, by conducting liquid phase synthesis while the particle size is monitored with photoluminescence or light absorption, the size of the semiconductor nanoparticle can be controlled at a desired size.

Subsequently, the metal fatty acid salt is bound to first non-metal atom N31 existing on the surface of the semiconductor nanoparticle. The metal fatty acid salt may be bound during formation of the semiconductor nanoparticle, or may be bound after formation of the semiconductor nanoparticle. For example, when indium myristate is bound to the semiconductor nanoparticle composed of InN, the semiconductor nanoparticle phosphor composed of InN can be made by filling a flask or the like with 1-octadecene (solvent for synthesis), and mixing indium myristate and sodium amide. At this time, the semiconductor nanoparticle phosphor composed of InN in which an indium element of indium myristate is bound to a nitrogen atom existing on the surface of the semiconductor nanoparticle composed of InN can be made.

Subsequently, the organic compound containing a functional group having hetero atoms on both ends is bound to first metal atom M31 existing on the surface of the semiconductor nanoparticle. For example, when the organic compound containing a functional group having hetero atoms on both ends is bound to the semiconductor nanoparticle phosphor composed of InN, the semiconductor nanoparticle phosphor composed of InN in which a nitrogen element of 1,6-hexanediamine is bound to an indium element existing on the surface of the semiconductor nanoparticle composed of InN can be made by mixing 1,6-hexanediamine with a solution of the semiconductor nanoparticle composed of InN to which indium myristate is bound, the semiconductor nanoparticle being made by the aforementioned method.

In the method for manufacturing the semiconductor nanoparticle of the present embodiment, the metal fatty acid salt is bound to first non-metal atom N31 existing on the surface of the semiconductor nanoparticle, and thereafter, the hetero atom-containing organic compound is bound to first metal atom M31 existing on the surface of the semiconductor nanoparticle to which no metal fatty acid salt is bound. Therefore, when the hetero atom-containing organic compound is bound to the surface of the semiconductor nanoparticle, peeling of the metal fatty acid salt from first non-metal atom N31 is not generated, and binding of first non-metal atom N31 and the metal fatty acid salt is maintained. Accordingly, a surface defect is not generated in the semiconductor nanoparticle phosphor, and the semiconductor nanoparticle phosphor has excellent light emission efficiency.

[Embodiment 3-2]

Figure 16:
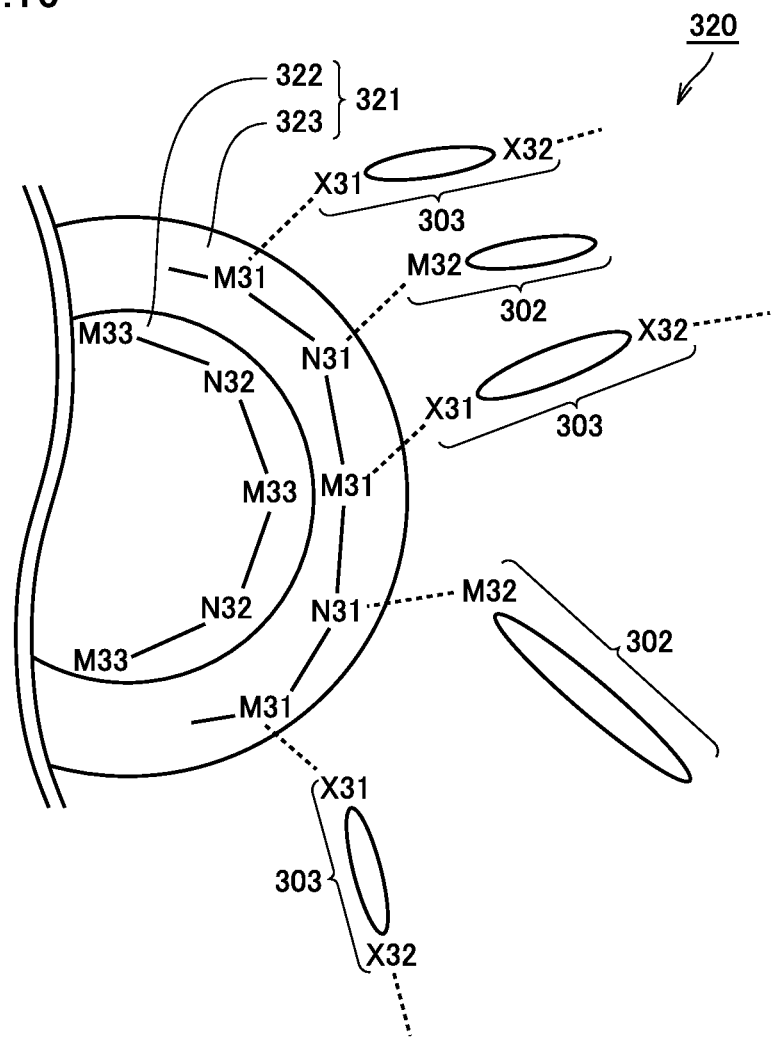
FIG. 16 is a schematic view of a surface of a semiconductor nanoparticle phosphor in one embodiment of the present invention.

A semiconductor nanoparticle phosphor in one embodiment of the present invention will be described with reference to FIG. 16. In a semiconductor nanoparticle phosphor 320 of Embodiment 3-2, as a semiconductor nanoparticle, a semiconductor nanoparticle 321 having a core/shell structure containing a semiconductor core 322 and a shell layer 323 covering the semiconductor core is used. Shell layer 323 contains first non-metal atom N31 and first metal atom M31, metal fatty acid salt 302 is bound to first non-metal atom N31, and organic compound 303 containing a functional group having hetero atoms on both ends is bound to first metal atom M31.

In the present embodiment, since semiconductor core 322 is protected with shell layer 323, generation of the dangling bond and defect is suppressed in the semiconductor core. Therefore, inactivation of excitation energy can be suppressed, and the light emission efficiency of semiconductor nanoparticle 321 is improved. Further, at least a part of first non-metal atom N31 existing on the surface of shell layer 323 is bound to metal fatty acid salt 302, and at least a part of first metal atom M31 is bound to hetero atom-containing organic compound 303. Accordingly, the dangling bonds of first non-metal atom N31 and first metal atom M31 are capped, the surface defect of shell layer 323 is suppressed, and the light emission efficiency of semiconductor nanoparticle 321 is improved.

Semiconductor core 322 preferably contains a second non-metal atom N32 and a third metal atom M33. As semiconductor core 322, for example, one kind of a semiconductor crystal such as InP, InN, InAs, InSb, InBi, CdSe, CdS, CdTe, ZnO, $In_2O_3$, $Ga_2O_3$, CdO, $ZrO_2$, $In_2S_3$, $Ga_2S_3$, $In_2Se_3$, $Ga_2Se_3$, $In_2Te_3$ or $Ga_2Te_3$ can be used. The semiconductor having such composition has a band gap energy at which visible light with a wavelength of 380 nm to 780 nm is emitted. Therefore, by controlling a particle size of the semiconductor core and a mixed crystal ratio thereof, a semiconductor core capable of emitting any visible light can be formed.

Shell layer 323 contains first non-metal atom N31 and first metal atom M31. Here, as first non-metal atom N31 and first metal atom M31, a non-metal atom and a metal atom that are the same as those of Embodiment 3-1 can be used. As shell layer 323, for example, one kind of a semiconductor crystal such as InP, InN, InAs, InSb, InBi, ZnO, $In_2O_3$, $Ga_2O_3$, $ZrO_2$, $In_2S_3$, $Ga_2S_3$, $In_2Se_3$, $Ga_2Se_3$, $In_2Te_3$, $Ga_2Te_3$, CdSe, CdTe, CdS or ZnS can be used. The shell layer has a thickness of preferably about 0.1 nm to 10 nm.

As a combination of semiconductor core 322 and shell layer 323 (hereinafter, in A/B in the present paragraph, A indicates a semiconductor core, and B indicates a shell layer), for example, InP/GaP, InN/GaN, InN/ZnS, InP/ZnS, InN/ZnO, InP/ZnO, InN/In$_2$O$_3$ and InP/In$_2$O$_3$ can be used.

As metal fatty acid salt 302 and hetero atom-containing organic compound 303, a salt and a compound that are the same as those of Embodiment 3-1 can be used.

<Method for Manufacturing Semiconductor Nanoparticle Phosphor>

A method for manufacturing the semiconductor nanoparticle phosphor of Embodiment 3-2 will be described. The method for manufacturing the semiconductor nanoparticle phosphor includes the steps of: obtaining the semiconductor nanoparticle containing a semiconductor core and a shell layer having first non-metal atom N31 and first metal atom M31 covering the semiconductor core; binding the metal fatty acid salt to first non-metal atom N31 existing on the surface of the semiconductor nanoparticle; and binding the organic compound containing a functional group having hetero atoms on both ends to first metal atom M31 existing on the surface of the semiconductor nanoparticle. The method for manufacturing the semiconductor nanoparticle phosphor of Embodiment 3-2 is similar to that in Embodiment 3-1 except that the semiconductor nanoparticle having a core/shell structure is made in the step of obtaining the semiconductor nanoparticle. Therefore, the step of obtaining the semiconductor nanoparticle having a core/shell structure will be described below.

A method for obtaining the semiconductor nanoparticle having a core/shell structure is not particularly limited, and a sol gel method (colloid method), a hot soap method, a reverse micelle method, a solvothermal method, a molecular precursor method, a hydrothermal synthesis method, a flux method or the like can be used. From the viewpoint of suitably manufacturing the semiconductor nanoparticle having a core/shell structure composed of the compound semiconductor material, a hot soap method is preferably used. One example of the method for manufacturing the semiconductor nanoparticle having a core/shell structure by hot soap method will be shown below.

First, the semiconductor core is subjected to liquid phase synthesis. For example, when a semiconductor core composed of InN is manufactured, a flask or the like is filled with 1-octadecene (solvent for synthesis), and indium myristate and sodium amide are mixed with each other. After this mixed liquid is sufficiently stirred, the materials are caused to react at 180 to 280° C. This provides the semiconductor core composed of InN.

Then, a reaction reagent serving as a raw material of the shell layer is added to a solution containing the semiconductor core, and the materials are caused to react under heating. This provides the semiconductor nanoparticle in which the external surface of the semiconductor core is covered with the shell layer.

[Embodiment 3-3]

<Wavelength Converter>

A wavelength converter in one embodiment of the present invention will be described with reference to FIG. 17. The wavelength converter includes the semiconductor nanoparticle phosphor described in Embodiment 3-1 or Embodiment 3-2 and an acrylic resin, and the semiconductor nanoparticle is sealed in the acrylic resin.

Figure 17:
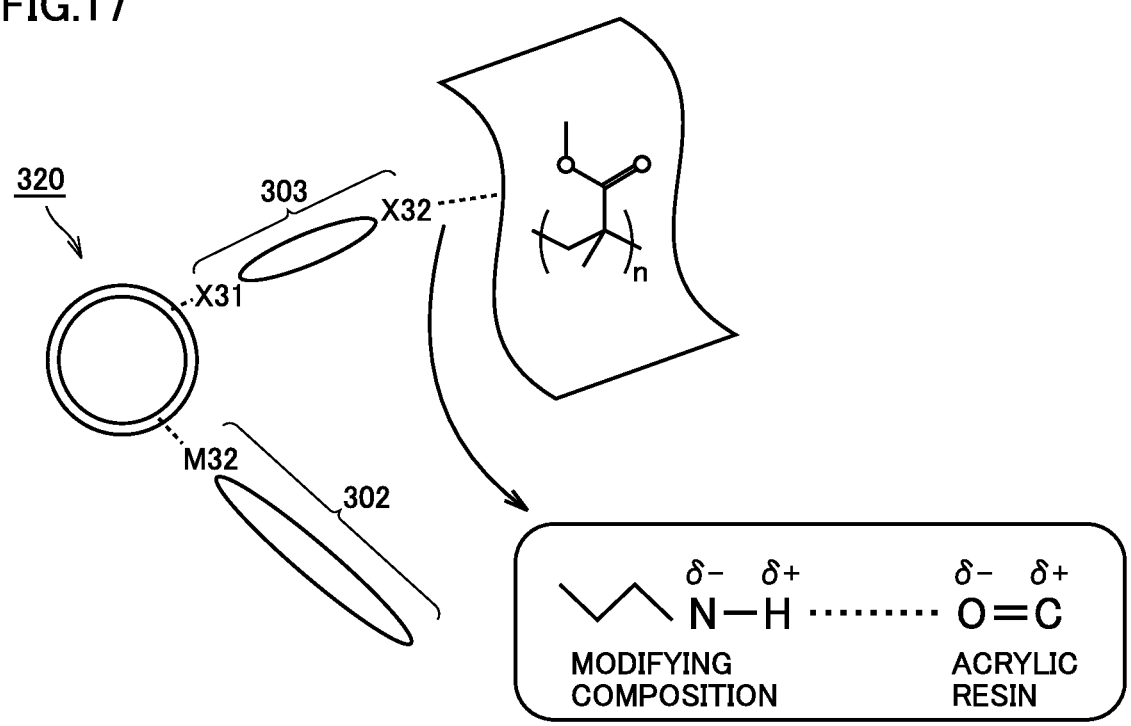
FIG. 17 is a schematic view showing a semiconductor nanoparticle phosphor and an acrylic resin in a wavelength converter in one embodiment of the present invention.

FIG. 17 is a schematic view showing the semiconductor nanoparticle phosphor and the acrylic resin in the wavelength converter. In semiconductor nanoparticle phosphor 320, hetero atom-containing organic compound 303 containing first functional group X31 having a hetero atom at one end and containing second functional group X32 having a hetero atom at the other end exists. First functional group X31 is bound to the semiconductor nanoparticle, and second functional group X32 is not bound to the semiconductor nanoparticle. The acrylic resin contains an ester bond represented by —C(=O)—O—. When the semiconductor nanoparticle phosphor is dispersed in the acrylic resin, the ester bond of the acrylic resin is bound to second functional group X32 existing in the semiconductor nanoparticle phosphor. Therefore, when the semiconductor nanoparticle phosphor is sealed with the acrylic resin, the semiconductor nanoparticle phosphor can be dispersed stably in the acrylic resin without phase separation or aggregation. Accordingly, degradation in light emission efficiency of the semiconductor nanoparticle phosphor can be suppressed.

As the acrylic resin, methyl acrylate, ethyl acrylate, butyl acrylate, isobutyl acrylate or the like can be used.

The volumetric ratio of the semiconductor nanoparticle phosphor to the acrylic resin may be a value depending on utility of the wavelength converter, and the ratio is preferably greater than or equal to 0.000001 and less than or equal to 10. When the volumetric ratio is greater than or equal to 0.000001 and less than or equal to 10, the semiconductor nanoparticle phosphors more hardly aggregate, and are easily dispersed in the acrylic resin more uniformly. When the transparency of the wavelength converter is regarded as important, the volumetric ratio of the semiconductor nanoparticle phosphor to the acrylic resin is preferably less than or equal to 0.2, and further preferably less than or equal to 0.1. When the volumetric ratio is less than or equal to 0.2, the wavelength converter having high transparency can be obtained, and when the volumetric ratio is less than or equal to 0.1, the wavelength converter having further high transparency can be obtained. When the light emission amount of the wavelength converter is regarded as important, the volumetric ratio of the semiconductor nanoparticle phosphor to the acrylic resin is preferably greater than or equal to 0.00001. When the volumetric ratio is greater than or equal to 0.00001, the wavelength converter having great light emission amount can be obtained.

<Method for Manufacturing Wavelength Converter>

A method for manufacturing the wavelength converter of Embodiment 3-3 will be described. First, the semiconductor nanoparticle phosphor of Embodiment 3-1 or Embodiment 3-2 is prepared. Then, a process for curing the acrylic resin is conducted after the semiconductor nanoparticle phosphor is dispersed in the acrylic resin. The method for dispersing the semiconductor nanoparticle phosphor in the acrylic resin can be conducted by stirring a solution in which the acrylic resin is mixed with the semiconductor nanoparticle phosphor, etc. As the curing method, a photocuring method for curing the material by irradiation of ultraviolet rays, or a thermal curing method for curing the material by heating can be used.

[Embodiment 4-3]

A light emitting device in one embodiment of the present invention will be described with reference to FIGS. 18 to 20.

Figure 18:
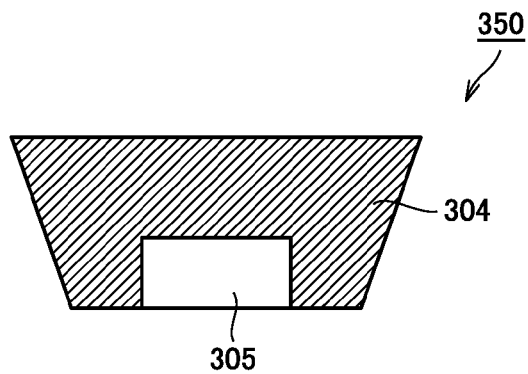
FIG. 18 is a schematic cross-sectional view of a light emitting device in one embodiment of the present invention.

As shown in FIG. 18, a light emitting device 350 includes an excitation light source 305, and a wavelength converter 304 covering at least a part of the surface of excitation light source 305. By excitation light emitted from excitation light source 305, a semiconductor nanoparticle phosphor contained in wavelength converter 304 is excited, and the semiconductor nanoparticle phosphor emits fluorescence with a wavelength different from that of excitation light. By combining the wavelength of excitation light emitted from excitation light source 305 and the wavelength of fluorescence emitted from the semiconductor nanoparticle phosphor, a light emitting device having a desired light emission spectrum can be obtained.

Wavelength converter 304 can contain a plurality of layers. In this case, each of the plurality of layers can contain a different semiconductor nanoparticle phosphor. Each of the plurality of layers can contain the semiconductor nanoparticle phosphor at a different concentration.

Figure 19:
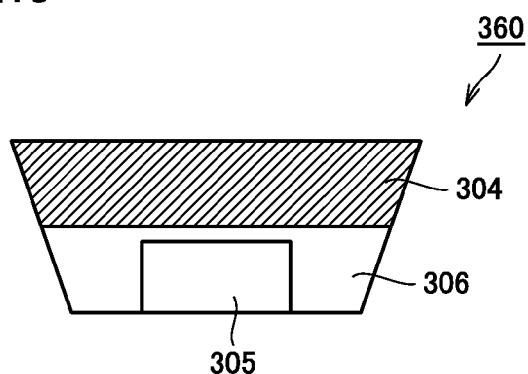
FIG. 19 is a schematic cross-sectional view of the light emitting device in one embodiment of the present invention.

FIG. 19 is a schematic cross-sectional view showing another form of the light emitting device. As shown in FIG. 19, in a light emitting device 360, a transparent member 306 is arranged between excitation light source 305 and wavelength converter 304, and excitation light source 305 and wavelength converter 304 are not contacted to each other. This makes it possible to alleviate influences of heat from excitation light source 305 on wavelength converter 304. Therefore, the light emitting device can have stable color temperature and stable luminance over a long period of time.

Figure 20:
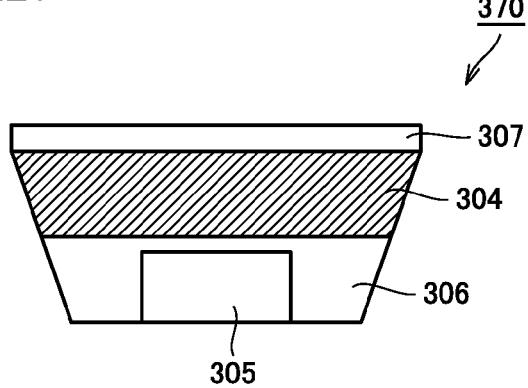
FIG. 20 is a schematic cross-sectional view of the light emitting device in one embodiment of the present invention.

As shown in FIG. 20, a light emitting device 370 may have a transparent inorganic substance layer 307 on the surface of wavelength converter 304. According to this constitution, the gas barrier property of light emitting device 370 is improved, and the light emitting device can have stable color temperature and stable luminance over a long period of time. As inorganic substance layer 307, a glass material such as tetramethoxysilane (TMOS), tetraethoxysilane (TEOS), tetrapropoxysilane, tetrabutoxysilane, etc. can be used.

EXAMPLES

The present invention will be described in further detail below, but not limited to examples shown below.

Example 1

To indium myristate (0.5 mmol) were added hexadecanethiol (0.5 mmol), trimethylsilylphosphine (TMS)$_3$P (0.5 mmol) and 10 ml of hexadecane, and the mixture was heated at about 180° C. for 1 hour. Thereby, a solution containing an InP colloid particle having a surface protected with hexadecanethiol was obtained. This solution was heated at 200° C. for 30 minutes in the atmospheric air. Thus, a nanoparticle phosphor (InP/In$_2$O$_3$ (material of nanoparticle/material of inorganic substance layer)) of Example 1 was obtained.

When an InN layer (inorganic substance layer) is formed on the surface of the InP particle (nanoparticle), it is preferable to reduce the surface of the InP colloid particle while ammonia gas is bubbled into the solution containing the InP colloid particle.

Example 2

A nanoparticle phosphor was obtained in accordance with the method described in Example 1 except that a nanoparticle composed of a nanoparticle core composed of InP and a shell layer composed of ZnS was used.

Specifically, to indium myristate (0.5 mmol) were added zinc stearate (0.5 mmol), dodecanethiol (0.5 mmol), trimethylsilylphosphine (TMS)$_3$P (1.5 mmol) and 10 ml of hexadecane, and the temperature was raised to 300° C. for 3 minutes. Thereby, a solution containing a nanoparticle (colloid particle) including the nanoparticle core composed of InP and the shell layer composed of ZnS was obtained. This solution was heated at 200° C. for 30 minutes in the atmospheric air. Thus, a nanoparticle phosphor (InP/ZnS/ZnO (material of nanoparticle core/material of shell layer/material of inorganic substance layer)) of Example 2 was obtained.

In the present example, an inorganic substance layer composed of ZnO is formed on the surface of the nanoparticle. This makes it easy to bind a modifying organic compound to the surface of the inorganic substance layer, as compared with Example 1 in which the inorganic substance layer composed of In$_2$O$_3$ was formed. Accordingly, since the dispersibility of the nanoparticle phosphor can be enhanced, precipitation of the nanoparticle phosphor due to aggregation of the nanoparticle phosphors can be prevented. Therefore, since generation of charge transfer between nanoparticles can be prevented, generation of non-radiative relaxation of an exciton due to such charge transfer can be prevented. That is, it is said that, in the nanoparticle phosphor of the present example, the light emission property can be enhanced more easily than the nanoparticle phosphor of Example 1.

When the material of the shell layer covering the nanoparticle core composed of InP is changed, the kind of the first metal atom positioned on the surface side of the nanoparticle can be changed. This makes it possible, as a material of the inorganic substance layer, to select a material suitable for each utility of the nanoparticle phosphor among more kinds of materials. Accordingly, the nanoparticle phosphor can have a wide range of utility.

Example 3

A particle in which an In$_2$O$_3$ layer (inorganic substance layer) was provided on the surface of the nanoparticle composed of InP was prepared in accordance with the method for preparing the nanoparticle phosphor described in Example 1. Then, oleic acid (modifying organic compound) was added to a hexadecane solution containing this particle to cause reaction at 200° C. for 30 minutes. Thus, a nanoparticle phosphor of Example 3 was obtained.

In the present example, oleic acid is bound to the surface of the particle in which an In$_2$O$_3$ layer (inorganic substance layer) was provided on the surface of the nanoparticle composed of InP. Accordingly, since the dispersibility of the nanoparticle phosphor can be enhanced as compared with Example 1, precipitation of the nanoparticle phosphor due to aggregation of the nanoparticle phosphors can be prevented. Therefore, since generation of charge transfer between nanoparticles can be prevented, generation of non-radiative relaxation of an exciton due to such charge transfer can be prevented. As a result, in the nanoparticle phosphor of the present example, the light emission property can be enhanced than the nanoparticle phosphor of Example 1.

Example 4

A nanoparticle composed of InP was prepared in accordance with the method described in Example 1. Sulfur (0.25 mmol) was supplied to the nanoparticle, and a reducing agent was supplied to the surface of the nanoparticle. Thereby, an In$_2$S$_3$ layer (first inorganic substance layer) was formed on a part of the surface of the nanoparticle. The resulting particle was subjected to oxidation reaction at 180° C. in the atmospheric air. Thereby, an In$_2$O$_3$ layer (second inorganic substance layer) was formed on the portion where the In$_2$S$_3$ layer had not been formed in the surface of the nanoparticle. Thus, a nanoparticle phosphor of Example 4 was obtained.

In the present example, the In$_2$S$_3$ layer and the In$_2$O$_3$ layer are formed on the surface of the nanoparticle composed of InP, respectively. When the In$_2$S$_3$ layer is formed on the surface of the nanoparticle composed of InP, an uncombined bond existing on the surface of the nanoparticle composed of InP is inactivated by the In$_2$S$_3$ layer. Accordingly, generation of non-radiative relaxation due to an uncombined bond on the surface of the nanoparticle can be prevented, as compared with the case where only the $In_2O_3$ layer is formed on the surface of the nanoparticle composed of InP.

By forming the $In_2O_3$ layer on the surface of the nanoparticle composed of InP, deterioration of the nanoparticle due to an external factor can be prevented. Accordingly, by optimizing the coverage with the $In_2S_3$ layer and the coverage with the $In_2O_3$ layer in the nanoparticle composed of InP, a nanoparticle phosphor having desired property can be obtained.

Example 5

A particle in which an $In_2O_3$ layer (inorganic substance layer) was provided on the surface of a nanoparticle composed of InP was prepared in accordance with the method for preparing the nanoparticle phosphor described in Example 1. Then, a $TiO_2$ crystal layer (ultraviolet absorbing layer) was formed on the surface of the $In_2O_3$ layer (inorganic substance layer) by a sol gel method. Specifically, tetraisopropyl orthotitanate (0.2 mmol), acetylacetone (1.0 mmmol), $H_2O$ (5.5 mmmol) and 2-propanol (20 mmmol) were stirred at 50° C. for 1 hour. The resulting product was washed with a mixture of 2-propanol and toluene, dried, and heated at 100° C. to 300° C. for 30 minutes. Thereby, the $TiO_2$ crystal layer (ultraviolet absorbing layer) was formed on the surface of the $In_2O_3$ layer (inorganic substance layer). Thus, a nanoparticle phosphor of Example 5 was obtained.

In the present example, since the $TiO_2$ crystal layer absorbs ultraviolet rays, deterioration of the nanoparticle phosphor due to irradiation of ultraviolet rays can be prevented.

Comparative Example 1

A nanoparticle phosphor of Comparative Example 1 was manufactured in accordance with the method for preparing the nanoparticle described in Example 2. An inorganic substance layer was not provided on the resulting nanoparticle phosphor.

Comparative Example 2

A nanoparticle composed of InP was prepared n accordance with the method described in Example 1. To the nanoparticle composed of InP was added sodium hexametaphosphate (0.25 mmol), and the mixture was stirred for a while, to thereby bind hexametaphosphoric acid to the surface of the nanoparticle. Thus, a nanoparticle phosphor of Comparative Example 2 was obtained.

<Results>

The light emission intensity of each of the nanoparticle phosphors of Examples 1 to 5, the nanoparticle phosphor of Comparative Example 1 and the nanoparticle phosphor of Comparative Example 2 was measured. The results are shown in Table 1.

TABLE 1

| | Presence or absence of inorganic substance layer | Light emission intensity (a.u.) |
|---|---|---|
| Example 1 | Presence (FIG. 1) | 80 |
| Example 2 | Presence (FIG. 3) | 90 |
| Example 3 | Presence (FIG. 4) | 90 |
| Example 4 | Presence (FIG. 5) | 70 |
| Example 5 | Presence (FIG. 6) | 90 |
| Comparative Example 1 | Absence (Nanoparticle of Example 2) | 60 |

TABLE 1-continued

| | Presence or absence of inorganic substance layer | Light emission intensity (a.u.) |
|---|---|---|
| Comparative Example 2 | Absence (Compound is bound to surface of nanoparticle) | 40 |

In Examples 1 to 5, the light emission intensity of each of the nanoparticle phosphors was high, as compared with those of Comparative Examples 1 and 2. Accordingly, it was found that, when the nanoparticle phosphors of Examples 1 to 5 are used, an optical device excellent in light emission property can be provided.

Example 2-1

(Manufacturing of Semiconductor Nanoparticle Phosphor)

To indium myristate (0.5 mmol) were added oleylamine (0.5 mmol), sodium amide (1.5 mmol) and 10 ml of hexadecane, and the mixture was heated at about 180° C. for 1 hour. Thereby, a solution containing an InN colloid particle having a surface protected with oleylamine was obtained. To this solution was added gallium myristate (0.5 mmol), and the mixture was heated at about 180° C. for 1 hour. Thus, a nanoparticle phosphor (InN/InGaN (semiconductor nanoparticle phosphor/surface region constituent element containing two or more kinds of bonds) of Example 2-1 was obtained.

(Manufacturing of Light Emitting Element)

This semiconductor nanoparticle phosphor was dispersed in tetraethoxysilane (TEOS), and the resultant was glass-sealed by curing-treatment, so that a light emitting element in which the semiconductor nanoparticle phosphor was dispersed in the transparent resin was made. The semiconductor nanoparticle phosphor and TEOS were mixed at a ratio of 5:10000 as expressed by volumetric ratio.

(Performance Evaluation)

The light emission intensity of fluorescence emitted when excitation light with a wavelength of 450 nm was absorbed by the resulting semiconductor nanoparticle phosphor was measured, and the ratio of the number of emitted photons to the number of absorbed photons was adopted as light emission efficiency.

(Evaluation Results)

The semiconductor nanoparticle phosphor of Example 2-1 maintained excellent light emission efficiency.

Example 2-2

(Manufacturing of Semiconductor Nanoparticle Phosphor)

To indium myristate (0.5 mmol) were added oleylamine (0.5 mmol), sodium amide (1.5 mmol) and 10 ml of hexadecane, and the mixture was heated at about 180° C. for 1 hour. Thereby, a solution containing an InN colloid particle having a surface protected with oleylamine was obtained. To this solution was added gallium myristate (0.5 mmol), and the mixture was heated at about 180° C. for 1 hour. Further, this solution was heated at 200° C. for 30 minutes in the atmospheric air. Thus, a nanoparticle phosphor (InN/InGaO (semiconductor nanoparticle phosphor/surface region constituent element containing two or more kinds of bonds)) of Example 2-2 was obtained.

(Manufacturing of Light Emitting Element)

This semiconductor nanoparticle phosphor was dispersed in tetraethoxysilane (TEOS), and the resultant was glass-sealed by curing-treatment, so that a light emitting element in which the semiconductor nanoparticle phosphor was dispersed in the transparent resin was made. The semiconductor nanoparticle phosphor and TEOS were mixed at a ratio of 5:10000 as expressed by volumetric ratio.

(Performance Evaluation)

The light emission intensity of fluorescence emitted when excitation light with a wavelength of 450 nm was absorbed by the resulting semiconductor nanoparticle phosphor was measured, and the ratio of the number of emitted photons to the number of absorbed photons was adopted as light emission efficiency.

(Evaluation Results)

The semiconductor nanoparticle phosphor of Example 2-2 maintained excellent light emission efficiency.

Example 2-3

(Manufacturing of Semiconductor Nanoparticle Phosphor)

To indium myristate (0.5 mmol) were added oleylamine (0.5 mmol), sodium amide (1.5 mmol) and 10 ml of hexadecane, and the mixture was heated at about 180° C. for 1 hour. Thereby, a solution containing an InN colloid particle having a surface protected with oleylamine was obtained. To this solution was added zinc undecylenate (0.5 mmol), and the mixture was heated at about 180° C. for 1 hour. Further, to this solution was added a solution of 0.4 mM ammonium sulfide in oleylamine (0.4 µmol), and the mixture was heated at 100° C. for 10 minutes. Thus, a nanoparticle phosphor (InN/InZnS (semiconductor nanoparticle phosphor/surface region constituent element containing two or more kinds of bonds)) of Example 2-3 was obtained.

(Manufacturing of Light Emitting Element)

This semiconductor nanoparticle phosphor was dispersed in tetraethoxysilane (TEOS), and the resultant was glass-sealed by curing-treatment, so that a light emitting element in which the semiconductor nanoparticle phosphor was dispersed in the transparent resin was made. The semiconductor nanoparticle phosphor and TEOS were mixed at a ratio of 5:10000 as expressed by volumetric ratio.

(Performance Evaluation)

The light emission intensity of fluorescence emitted when excitation light with a wavelength of 450 nm was absorbed by the resulting semiconductor nanoparticle phosphor was measured, and the ratio of the number of emitted photons to the number of absorbed photons was adopted as light emission efficiency.

(Evaluation Results)

The semiconductor nanoparticle phosphor of Example 2-3 maintained excellent light emission efficiency.

Example 2-4

(Manufacturing of Semiconductor Nanoparticle Phosphor)

A particle in which the surface region of constituent elements InGaN was provided on the surface of the nanoparticle composed of InN was prepared in accordance with the method for manufacturing the nanoparticle phosphor described in Example 2-1. Then, a $TiO_2$ crystal (ultraviolet absorbing substance) was formed on a part of the external side of the constituent elements InGaN surface region by sol gel method. Specifically, tetraisopropyl orthotitanate (0.2 mmol), acetylacetone (1.0 mmmol), $H_2O$ (5.5 mmmol) and 2-propanol (20 mmmol) were stirred at 50° C. for 1 hour. The resulting product was washed with a mixture of 2-propanol and toluene, dried, and heated at 100° C. to 300° C. for 30 minutes. Thereby, the $TiO_2$ crystal (ultraviolet absorbing substance) was formed on the external side of the constituent elements InGaN surface region. Thus, a nanoparticle phosphor of Examples 2-4 was obtained.

(Manufacturing of Light Emitting Element)

This semiconductor nanoparticle phosphor was dispersed in tetraethoxysilane (TEOS), and the resultant was glass-sealed by curing-treatment, so that a light emitting element in which the semiconductor nanoparticle phosphor was dispersed in the transparent resin was made. The semiconductor nanoparticle phosphor and TEOS were mixed at a ratio of 5:10000 as expressed by volumetric ratio.

(Performance Evaluation)

The light emission intensity of fluorescence emitted when excitation light with a wavelength of 450 nm was absorbed by the resulting semiconductor nanoparticle phosphor was measured, and the ratio of the number of emitted photons to the number of absorbed photons was adopted as light emission efficiency.

(Evaluation Results)

The semiconductor nanoparticle phosphor of Example 2-4 maintained excellent light emission efficiency.

Example 3-1

(Manufacturing of Semiconductor Nanoparticle Phosphor)

One millimol of indium myristate and 10 mmol of sodium amide were mixed with 1-octadecene, and the mixture was subjected to a thermal degradation reaction at 200° C. to prepare a semiconductor nanoparticle (particle size 3 nm) composed of InN. Then, to a liquid containing the semiconductor nanoparticle composed of InN was added 1 mmol of gallium myristate, and the materials were caused to react at 150° C. to obtain a semiconductor nanoparticle phosphor in which gallium myristate was bound to the surface of the semiconductor nanoparticle composed of InN.

(Manufacturing of Light Emitting Device)

Using the resulting semiconductor nanoparticle phosphor, the light emitting device shown in FIG. 18 was made. As the excitation light source, a LED element with a wavelength of 450 nm was used. The resulting semiconductor nanoparticle phosphor was dispersed in an acrylic resin, and this was subjected to curing-treatment to make a wavelength converter in which the semiconductor nanoparticle phosphor was dispersed in the acrylic resin. The semiconductor nanoparticle phosphor and the acrylic resin were mixed at a ratio of 5:10000 as expressed by volumetric ratio.

(Performance Evaluation)

The light emission intensity of fluorescence emitted when excitation light with a wavelength of 450 nm was absorbed by the resulting semiconductor nanoparticle phosphor was measured, and the ratio of the number of emitted photons to the number of absorbed photons was adopted as light emission efficiency.

(Evaluation Results)

The semiconductor nanoparticle phosphor of Example 3-1 had excellent light emission efficiency.

Example 3-2

(Manufacturing of Semiconductor Nanoparticle Phosphor)

One millimol of indium myristate and 10 mmol of sodium amide were mixed with 1-octadecene, and the mixture was subjected to a thermal degradation reaction at 200° C. to prepare a semiconductor nanoparticle phosphor (particle size 3 nm) in which indium stearate was bound to the surface of a semiconductor nanoparticle composed of InN.

(Manufacturing of Light Emitting Element)

This semiconductor nanoparticle phosphor was dispersed in an acrylic resin, and this was subjected to curing-treatment to make a wavelength converter in which the semiconductor nanoparticle phosphor was dispersed in the acrylic resin. The semiconductor nanoparticle phosphor and the acrylic resin were mixed at a ratio of 5:10000 as expressed by volumetric ratio.

(Performance Evaluation)

The light emission intensity of fluorescence emitted when excitation light with a wavelength of 450 nm was absorbed by the resulting semiconductor nanoparticle phosphor was measured, and the ratio of the number of emitted photons to the number of absorbed photons was adopted as light emission efficiency.

(Evaluation Results)

The semiconductor nanoparticle phosphor of Example 3-2 had excellent light emission efficiency.

Example 3-3

(Manufacturing of Semiconductor Nanoparticle Phosphor)

One millimol of indium myristate and 10 mmol of sodium amide were mixed with 1-octadecene, and the mixture was subjected to a thermal degradation reaction at 200° C. to prepare a semiconductor nanoparticle (particle size 3 nm) composed of InN. Into a solution containing the nanoparticle core were mixed 2 mmol of zinc stearate and 2 mmol of sulfur element as raw materials of a shell layer, and the mixture was subjected to a thermal degradation reaction at 200° C. to prepare a semiconductor nanoparticle having a core/shell structure composed of InN/ZnS (shell thickness 2 nm).

(Manufacturing of Light Emitting Element)

This semiconductor nanoparticle phosphor was dispersed in an acrylic resin, and this was subjected to curing-treatment to make a wavelength converter in which the semiconductor nanoparticle phosphor was dispersed in the acrylic resin. The semiconductor nanoparticle phosphor and the acrylic resin were mixed at a ratio of 5:10000 as expressed by volumetric ratio.

(Performance Evaluation)

The light emission intensity of fluorescence emitted when excitation light with a wavelength of 450 nm was absorbed by the resulting semiconductor nanoparticle phosphor was measured, and the ratio of the number of emitted photons to the number of absorbed photons was adopted as light emission efficiency.

(Evaluation Results)

The semiconductor nanoparticle phosphor of Example 3-3 had excellent light emission efficiency.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nanoparticle phosphor comprising:
   a nanoparticle composed of a compound semiconductor comprising a first metal atom, and
   an inorganic substance layer provided on at least a part of a surface of said nanoparticle and comprising said first metal atom and one or more kinds of hetero atoms, wherein
   in said inorganic substance layer, said first metal atom is bound to said hetero atom, and said first metal atom is bound to each hetero atom when the hetero atoms are more than one kind, and
   the inorganic substance layer has a thickness greater than or equal to 0.01 nm and less than or equal to 3 nm.

2. The nanoparticle phosphor according to claim 1, wherein in said inorganic substance layer, said first metal atom is arranged on said surface side of said nanoparticle.

3. The nanoparticle phosphor according to claim 1, wherein said inorganic substance layer comprises a compound having a band gap energy greater than that of said compound semiconductor.

4. The nanoparticle phosphor according to claim 1, further comprising a modifying organic compound bound to a surface of said inorganic substance layer.

5. The nanoparticle phosphor according to claim 1, wherein
   said inorganic substance layer has a first inorganic substance layer comprising said first metal atom and a first hetero atom, and a second inorganic substance layer comprising said first metal atom and a second hetero atom, and
   said first inorganic substance layer and said second inorganic substance layer are provided on said surface of said nanoparticle, respectively.

6. The nanoparticle phosphor according to claim 1, further comprising an ultraviolet absorbing layer provided on at least a part of a surface of said inorganic substance layer.

7. The nanoparticle phosphor according to claim 1, wherein said nanoparticle has a nanoparticle core composed of said compound semiconductor and a shell layer covering said nanoparticle core.

8. A semiconductor nanoparticle phosphor comprising:
   a semiconductor nanoparticle comprising a first metal atom M21 and a first non-metal atom Y20, and
   a second metal atom M22 binding to at least a part of said first non-metal atom Y20 existing on a surface of said semiconductor nanoparticle.

9. The semiconductor nanoparticle phosphor according to claim 8, wherein said semiconductor nanoparticle phosphor further comprises a second non-metal atom Z20 binding to at least a part of said first metal atom M21 existing on the surface of said semiconductor nanoparticle.

10. The semiconductor nanoparticle phosphor according to claim 8, wherein said second metal atom M22 is bound to said second non-metal atom Z20.

11. The semiconductor nanoparticle phosphor according to claim 8, wherein said first metal atom M21, said first non-metal atom Y20 and said second metal atom M22 form a surface region comprising two or more kinds of bonds on the surface of said semiconductor nanoparticle, and
   said semiconductor nanoparticle phosphor comprises an inorganic crystal outside said surface region.

12. A light emitting element comprising:
   a transparent member, and
   the semiconductor nanoparticle phosphor according to claim 8 dispersed in said transparent member.

* * * * *